(12) United States Patent
Chuang et al.

(10) Patent No.: US 10,778,925 B2
(45) Date of Patent: Sep. 15, 2020

(54) MULTIPLE COLUMN PER CHANNEL CCD SENSOR ARCHITECTURE FOR INSPECTION AND METROLOGY

(71) Applicant: KLA-Tencor Corporation, Milpitas, CA (US)

(72) Inventors: Yung-Ho Alex Chuang, Cupertino, CA (US); Jingjing Zhang, San Jose, CA (US); Sharon Zamek, Sunnyvale, CA (US); John Fielden, Los Altos, CA (US); Devis Contarato, San Carlos, CA (US); David L. Brown, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/439,297

(22) Filed: Jun. 12, 2019

(65) Prior Publication Data

US 2019/0313044 A1     Oct. 10, 2019

Related U.S. Application Data

(60) Continuation-in-part of application No. 16/397,072, filed on Apr. 29, 2019, which is a division of
(Continued)

(51) Int. Cl.
    *H04N 5/378*     (2011.01)
    *G01N 21/956*     (2006.01)
    (Continued)

(52) U.S. Cl.
    CPC ......... *H04N 5/378* (2013.01); *G01N 21/9501* (2013.01); *G01N 21/956* (2013.01);
(Continued)

(58) Field of Classification Search
None
See application file for complete search history.

(56) References Cited

U.S. PATENT DOCUMENTS

| 3,699,646 A | 10/1972 | Vadasz et al. |
| 3,870,917 A | 3/1975 | Cuny |

(Continued)

FOREIGN PATENT DOCUMENTS

| EP | 0543629 A1 | 5/1993 |
| EP | 0602983 A1 | 6/1994 |

(Continued)

OTHER PUBLICATIONS

U.S. Appl. No. 61/720,700—Certified Copy corres to PCT/EP2013/071080, pp. 1-44.

(Continued)

*Primary Examiner* — Clifford Hilaire
(74) *Attorney, Agent, or Firm* — Bever, Hoffman & Harms, LLP

(57) ABSTRACT

A multiple-column-per-channel image CCD sensor utilizes a multiple-column-per-channel readout circuit including connected transfer gates that alternately transfer pixel data (charges) from a group of adjacent pixel columns to a shared output circuit at high speed with low noise. Charges transferred along the adjacent pixel columns at a line clock rate are alternately passed by the transfer gates to a summing gate that is operated at multiple times the line clock rate to pass the image charges to the shared output circuit. A symmetrical fork-shaped diffusion is utilized in one embodiment to merge the image charges from the group of related pixel columns. A method of driving the multiple-column-per-channel CCD sensor with line clock synchronization is also described. A method of inspecting a sample using the multiple-column-per-channel CCD sensor is also described.

21 Claims, 14 Drawing Sheets

Related U.S. Application Data application No. 15/337,604, filed on Oct. 28, 2016, now Pat. No. 10,313,622.

(60) Provisional application No. 62/733,635, filed on Sep. 20, 2018, provisional application No. 62/319,130, filed on Apr. 6, 2016.

(51) Int. Cl.

| | |
|---|---|
| *H04N 5/361* | (2011.01) |
| *H04N 5/372* | (2011.01) |
| *H01L 27/148* | (2006.01) |
| *G01N 21/95* | (2006.01) |
| *G06T 7/00* | (2017.01) |

(52) U.S. Cl.
CPC ...... *G06T 7/0008* (2013.01); *H01L 27/14812* (2013.01); *H01L 27/14825* (2013.01); *H04N 5/361* (2013.01); *H04N 5/372* (2013.01); *G06T 2207/30148* (2013.01)

(56) References Cited

U.S. PATENT DOCUMENTS

| | | | |
|---|---|---|---|
| 3,914,748 A | 10/1975 | Barton et al. |
| 3,947,707 A | 3/1976 | Shannon et al. |
| 4,106,046 A | 8/1978 | Nathanson et al. |
| 4,210,922 A | 7/1980 | Shannon |
| 4,275,326 A | 6/1981 | Houtkamp |
| 4,280,141 A | 7/1981 | McCann et al. |
| 4,348,690 A | 9/1982 | Jastrzebski et al. |
| 4,382,267 A | 5/1983 | Angle |
| 4,467,189 A | 8/1984 | Tsuchiya |
| 4,555,731 A | 11/1985 | Zinchuk |
| 4,580,155 A | 4/1986 | Tsoi et al. |
| 4,644,221 A | 2/1987 | Gutierrez et al. |
| 4,760,031 A | 7/1988 | Janesick |
| 4,853,595 A | 8/1989 | Alfano et al. |
| 4,999,014 A | 3/1991 | Gold et al. |
| 5,120,949 A | 6/1992 | Tomasetti |
| 5,144,630 A | 9/1992 | Lin |
| 5,181,080 A | 1/1993 | Fanton et al. |
| 5,227,313 A | 7/1993 | Gluck et al. |
| 5,256,883 A | 10/1993 | Weichmann et al. |
| 5,315,126 A | 5/1994 | Field |
| 5,376,810 A | 12/1994 | Hoenk et al. |
| 5,428,392 A | 6/1995 | Castro et al. |
| 5,440,648 A | 8/1995 | Roberts et al. |
| 5,448,377 A * | 9/1995 | Kinoshita ............ G03B 27/462 358/449 |
| 5,483,378 A | 1/1996 | Rahn |
| 5,563,702 A | 10/1996 | Emery et al. |
| 5,608,526 A | 3/1997 | Piwonka-Corle et al. |
| 5,684,583 A | 11/1997 | Abe et al. |
| 5,717,518 A | 2/1998 | Shafer et al. |
| 5,719,069 A | 2/1998 | Sparks |
| 5,731,584 A | 3/1998 | Beyne et al. |
| 5,742,626 A | 4/1998 | Mead et al. |
| 5,760,809 A | 6/1998 | Malhotra et al. |
| 5,760,899 A | 6/1998 | Eismann |
| 5,812,190 A | 9/1998 | Audier et al. |
| 5,852,322 A | 12/1998 | Speckbacher |
| 5,877,859 A | 3/1999 | Aspnes et al. |
| 5,940,685 A | 8/1999 | Loomis et al. |
| 5,965,910 A | 10/1999 | Wood |
| 5,999,310 A | 12/1999 | Shafer et al. |
| 6,013,399 A | 1/2000 | Nguyen |
| 6,030,852 A | 2/2000 | Sano et al. |
| 6,064,759 A | 5/2000 | Buckley et al. |
| 6,162,707 A | 12/2000 | Dinh et al. |
| 6,201,601 B1 | 3/2001 | Vaez-Iravani et al. |
| 6,271,916 B1 | 8/2001 | Marxer et al. |
| 6,278,119 B1 | 8/2001 | Nikzad et al. |
| 6,285,018 B1 | 9/2001 | Aebi et al. |
| 6,297,879 B1 | 10/2001 | Yang et al. |
| 6,297,880 B1 | 10/2001 | Rosencwaig et al. |
| 6,307,586 B1 | 10/2001 | Costello |
| 6,346,700 B1 | 2/2002 | Cunningham et al. |
| 6,362,484 B1 | 3/2002 | Beyne et al. |
| 6,373,869 B1 | 4/2002 | Jacob |
| 6,403,963 B1 | 6/2002 | Nikzad et al. |
| 6,429,943 B1 | 8/2002 | Opsal et al. |
| 6,456,318 B1 | 9/2002 | Noguchi |
| 6,535,531 B1 | 3/2003 | Smith et al. |
| 6,545,281 B1 | 4/2003 | McGregor et al. |
| 6,608,676 B1 | 8/2003 | Zhao et al. |
| 6,711,283 B1 | 3/2004 | Soenksen |
| 6,837,766 B2 | 1/2005 | Costello |
| 7,005,637 B2 | 2/2006 | Costello et al. |
| 7,039,157 B2 | 5/2006 | Fujii et al. |
| 7,046,283 B1 | 5/2006 | Kamasz et al. |
| 7,126,699 B1 | 10/2006 | Wihl et al. |
| 7,130,039 B2 | 10/2006 | Vaez-Iravani et al. |
| 7,136,159 B2 | 11/2006 | Tsai et al. |
| 7,141,791 B2 | 11/2006 | Masnaghetti et al. |
| 7,227,984 B2 | 6/2007 | Cavan |
| 7,233,350 B2 | 6/2007 | Tay |
| 7,283,166 B1 | 10/2007 | Billman |
| 7,313,155 B1 | 12/2007 | Mu et al. |
| 7,321,468 B2 | 1/2008 | Herkommer et al. |
| 7,345,825 B2 | 3/2008 | Chuang et al. |
| 7,352,457 B2 | 4/2008 | Kvamme et al. |
| 7,432,517 B2 | 10/2008 | Botma et al. |
| 7,446,474 B2 | 11/2008 | Maldonado et al. |
| 7,465,935 B2 | 12/2008 | Urano et al. |
| 7,471,315 B2 | 12/2008 | Silsby et al. |
| 7,525,649 B1 | 4/2009 | Leong et al. |
| 7,528,943 B2 | 5/2009 | Brown et al. |
| 7,586,108 B2 | 9/2009 | Nihtianov et al. |
| 7,609,303 B1 | 10/2009 | Lee et al. |
| 7,609,309 B2 | 10/2009 | Brown et al. |
| 7,714,287 B1 | 5/2010 | James et al. |
| 7,741,666 B2 | 6/2010 | Nozaki et al. |
| 7,750,280 B2 | 7/2010 | Hwang et al. |
| 7,791,170 B2 | 9/2010 | Chiang et al. |
| 7,800,040 B2 | 9/2010 | Blacksberg et al. |
| 7,813,406 B1 | 10/2010 | Nguyen et al. |
| 7,838,833 B1 | 11/2010 | Lent et al. |
| 7,875,948 B2 | 1/2011 | Hynecek et al. |
| 7,928,382 B2 | 4/2011 | Hatakeyama et al. |
| 7,952,633 B2 | 5/2011 | Brown et al. |
| 7,957,066 B2 | 6/2011 | Armstrong et al. |
| 7,985,658 B2 | 7/2011 | Lei et al. |
| 7,999,342 B2 | 8/2011 | Hsu et al. |
| 8,017,427 B2 | 9/2011 | Manabe |
| 8,138,485 B2 | 3/2012 | Nihtianov et al. |
| 8,309,443 B2 | 11/2012 | Tanaka et al. |
| 8,323,406 B2 | 12/2012 | Bondokov et al. |
| 8,450,820 B2 | 5/2013 | Nanver et al. |
| 8,455,971 B2 | 6/2013 | Chen et al. |
| 8,513,587 B2 | 8/2013 | Wang et al. |
| 8,514,587 B2 | 8/2013 | Zhang et al. |
| 8,629,384 B1 | 1/2014 | Biellak et al. |
| 8,686,331 B2 | 4/2014 | Armstrong |
| 8,754,972 B2 | 6/2014 | Brown et al. |
| 8,755,417 B1 | 6/2014 | Dribinski |
| 8,873,596 B2 | 10/2014 | Dribinski et al. |
| 8,929,406 B2 | 1/2015 | Chuang et al. |
| 9,055,246 B2 | 6/2015 | Tay |
| 9,077,862 B2 | 7/2015 | Brown et al. |
| 9,131,175 B2 | 9/2015 | Kondou et al. |
| 9,279,774 B2 | 3/2016 | Romanovsky et al. |
| 9,282,271 B2 | 3/2016 | Hashimoto et al. |
| 9,305,949 B2 | 4/2016 | Chen et al. |
| 9,426,400 B2 | 8/2016 | Brown et al. |
| 9,478,402 B2 | 10/2016 | Chuang et al. |
| 9,496,425 B2 | 11/2016 | Chern et al. |
| 9,529,182 B2 | 12/2016 | Chuang et al. |
| 9,601,299 B2 | 3/2017 | Chuang et al. |
| 9,608,399 B2 | 3/2017 | Chuang et al. |
| 9,748,294 B2 | 8/2017 | Muramatsu et al. |
| 9,891,177 B2 | 2/2018 | Vazhaeparambil et al. |
| 10,197,501 B2 | 2/2019 | Chuang et al. |
| 2001/0012069 A1 | 8/2001 | Derndinger et al. |

(56) References Cited

U.S. PATENT DOCUMENTS

| | | |
|---|---|---|
| 2001/0017344 A1 | 8/2001 | Aebi |
| 2001/0024684 A1 | 9/2001 | Steiner et al. |
| 2001/0055424 A1 | 12/2001 | Publicover |
| 2002/0191834 A1 | 12/2002 | Fishbaine |
| 2003/0111707 A1 | 6/2003 | Takaura et al. |
| 2003/0210392 A1 | 11/2003 | Vaez-Iravani et al. |
| 2003/0222579 A1 | 12/2003 | Habib et al. |
| 2004/0012684 A1 | 1/2004 | Tinnerino |
| 2004/0021061 A1 | 2/2004 | Bijkerk |
| 2004/0032628 A1 | 2/2004 | Sato et al. |
| 2004/0056279 A1 | 3/2004 | Niigaki et al. |
| 2004/0074261 A1 | 4/2004 | Caron et al. |
| 2004/0212708 A1 | 10/2004 | Spartiotis et al. |
| 2004/0227070 A1 | 11/2004 | Bateman et al. |
| 2005/0122021 A1 | 6/2005 | Smith et al. |
| 2005/0167575 A1 | 8/2005 | Benz et al. |
| 2005/0168602 A1 | 8/2005 | Sumi et al. |
| 2005/0196059 A1 | 9/2005 | Inoue et al. |
| 2005/0224842 A1 | 10/2005 | Toyama et al. |
| 2005/0255625 A1 | 11/2005 | Janesick et al. |
| 2005/0264148 A1 | 12/2005 | Maldonado et al. |
| 2005/0287479 A1 | 12/2005 | Moon et al. |
| 2006/0054778 A1 | 3/2006 | Suhling |
| 2006/0069460 A1 | 3/2006 | Smith et al. |
| 2006/0087649 A1 | 4/2006 | Ogawa et al. |
| 2006/0170324 A1 | 8/2006 | Machuca et al. |
| 2006/0188869 A1 | 8/2006 | Zeskind et al. |
| 2007/0007429 A1 | 1/2007 | Fairley et al. |
| 2007/0023770 A1 | 2/2007 | Miyajima et al. |
| 2007/0034987 A1 | 2/2007 | Costello et al. |
| 2007/0058062 A1 | 3/2007 | Ohta |
| 2007/0072326 A1 | 3/2007 | Zheng et al. |
| 2007/0096648 A1 | 5/2007 | Nakajima et al. |
| 2007/0103769 A1 | 5/2007 | Kuwabara |
| 2007/0138378 A1 | 6/2007 | Chang et al. |
| 2007/0171298 A1 | 7/2007 | Kurane |
| 2007/0177289 A1 | 8/2007 | Shim et al. |
| 2007/0188744 A1 | 8/2007 | Leslie et al. |
| 2007/0210395 A1 | 9/2007 | Maruyama et al. |
| 2007/0229677 A1 | 10/2007 | Mochizuki et al. |
| 2007/0291810 A1 | 12/2007 | Luo et al. |
| 2008/0002037 A1 | 1/2008 | Ueda |
| 2008/0044932 A1 | 2/2008 | Samoilov et al. |
| 2008/0068593 A1 | 3/2008 | Nakano et al. |
| 2008/0074513 A1 | 3/2008 | Noguchi |
| 2008/0079830 A1 | 4/2008 | Lepage |
| 2008/0173903 A1 | 7/2008 | Imai et al. |
| 2008/0232674 A1 | 9/2008 | Sakai et al. |
| 2008/0267241 A1 | 10/2008 | Brown et al. |
| 2008/0278775 A1 | 11/2008 | Katzir et al. |
| 2008/0315092 A1 | 12/2008 | Kley |
| 2009/0009645 A1 | 1/2009 | Schrey et al. |
| 2009/0079973 A1 | 3/2009 | Uto et al. |
| 2009/0080759 A1 | 3/2009 | Bhaskar et al. |
| 2009/0091752 A1 | 4/2009 | Terasawa et al. |
| 2009/0108207 A1 | 4/2009 | Liu |
| 2009/0125242 A1 | 5/2009 | Choi et al. |
| 2009/0128912 A1 | 5/2009 | Okada et al. |
| 2009/0168152 A1 | 7/2009 | Gelernt et al. |
| 2009/0180176 A1 | 7/2009 | Armstrong et al. |
| 2009/0190015 A1 | 7/2009 | Bechtel et al. |
| 2009/0322903 A1 | 12/2009 | Hashimoto et al. |
| 2010/0026865 A1 | 2/2010 | Tivarus et al. |
| 2010/0038540 A1 | 2/2010 | Hannebauer |
| 2010/0102213 A1 | 4/2010 | Garris |
| 2010/0103409 A1 | 4/2010 | Ohshima et al. |
| 2010/0104173 A1 | 4/2010 | Yoshida et al. |
| 2010/0140675 A1 | 6/2010 | Rhodes |
| 2010/0148667 A1 | 6/2010 | Niigaki et al. |
| 2010/0188655 A1 | 7/2010 | Brown et al. |
| 2010/0194956 A1 | 8/2010 | Yuan et al. |
| 2010/0208979 A1 | 8/2010 | Abbott et al. |
| 2010/0301437 A1 | 12/2010 | Brown et al. |
| 2010/0309308 A1 | 12/2010 | Saphier et al. |
| 2011/0019044 A1 | 1/2011 | Wang et al. |
| 2011/0062499 A1 | 3/2011 | Burke |
| 2011/0073982 A1 | 3/2011 | Armstrong et al. |
| 2011/0101219 A1 | 5/2011 | Uchiyama et al. |
| 2011/0116077 A1 | 5/2011 | Chuang et al. |
| 2011/0168886 A1 | 7/2011 | Shadman et al. |
| 2011/0234790 A1 | 9/2011 | True |
| 2011/0256655 A1 | 10/2011 | Nikzad et al. |
| 2011/0261354 A1 | 10/2011 | Sinfield et al. |
| 2011/0279725 A1 | 11/2011 | Cazaux et al. |
| 2011/0291109 A1 | 12/2011 | Wraback et al. |
| 2012/0012811 A1 | 1/2012 | Deflumere et al. |
| 2012/0012957 A1 | 1/2012 | Larsen et al. |
| 2012/0038809 A1 | 2/2012 | Lee et al. |
| 2012/0081684 A1 | 4/2012 | Den et al. |
| 2012/0132823 A1 | 5/2012 | Menge et al. |
| 2012/0160993 A1 | 6/2012 | Nevet et al. |
| 2012/0170021 A1 | 7/2012 | Walsh |
| 2012/0228485 A1 | 9/2012 | Iwakiri et al. |
| 2012/0268722 A1 | 10/2012 | Nihtianov et al. |
| 2013/0009042 A1 | 1/2013 | Bechtel et al. |
| 2013/0009069 A1 | 1/2013 | Okada |
| 2013/0015324 A1 | 1/2013 | Park et al. |
| 2013/0016346 A1 | 1/2013 | Romanovsky et al. |
| 2013/0017205 A1 | 1/2013 | Giaccia et al. |
| 2013/0020491 A1 | 1/2013 | Mazzillo |
| 2013/0056843 A1 | 3/2013 | Lee et al. |
| 2013/0077086 A1 | 3/2013 | Chuang et al. |
| 2013/0082241 A1 | 4/2013 | Kub et al. |
| 2013/0088706 A1 | 4/2013 | Chuang et al. |
| 2013/0114085 A1 | 5/2013 | Wang et al. |
| 2013/0126705 A1 | 5/2013 | Maleev |
| 2013/0149807 A1 | 6/2013 | Jangjian et al. |
| 2013/0169957 A1 | 7/2013 | Wolf et al. |
| 2013/0176552 A1 | 7/2013 | Brown et al. |
| 2013/0270663 A1 | 10/2013 | Lin et al. |
| 2013/0313440 A1 | 11/2013 | Chuang et al. |
| 2013/0320211 A1 | 12/2013 | Park et al. |
| 2013/0336574 A1 | 12/2013 | Nasser-Ghodsi et al. |
| 2013/0341504 A1 | 12/2013 | Neill et al. |
| 2014/0111799 A1 | 4/2014 | Lei et al. |
| 2014/0151552 A1 | 6/2014 | Jiang et al. |
| 2014/0203386 A1 | 7/2014 | Bui et al. |
| 2014/0204427 A1 | 7/2014 | Nakazawa et al. |
| 2014/0246595 A1 | 9/2014 | Menge et al. |
| 2014/0305367 A1 | 10/2014 | Chuang et al. |
| 2014/0362203 A1 | 12/2014 | Delaney et al. |
| 2015/0007765 A1 | 1/2015 | Dribinski |
| 2015/0022699 A1 | 1/2015 | Shimada |
| 2015/0136956 A1 | 5/2015 | Yin et al. |
| 2015/0177159 A1 | 6/2015 | Brown et al. |
| 2015/0237282 A1 | 8/2015 | Shimada |
| 2015/0256778 A1 | 9/2015 | Kusaka |
| 2015/0275393 A1 | 10/2015 | Bondokov et al. |
| 2015/0294998 A1 | 10/2015 | Nihtianov et al. |
| 2015/0304580 A1 | 10/2015 | Wang |
| 2015/0358571 A1 | 12/2015 | Dominguez et al. |
| 2015/0365610 A1 | 12/2015 | Dominguez et al. |
| 2015/0369750 A1 | 12/2015 | Wang et al. |
| 2016/0037110 A1 | 2/2016 | Choi et al. |
| 2016/0050383 A1 | 2/2016 | Grauer et al. |
| 2016/0142653 A1 | 5/2016 | Cho et al. |
| 2016/0269657 A1 | 9/2016 | Nishihara |
| 2017/0195596 A1 | 7/2017 | Vogelsang et al. |
| 2017/0201698 A1 | 7/2017 | Parks et al. |

FOREIGN PATENT DOCUMENTS

| | | | |
|---|---|---|---|
| EP | 0746871 A1 | 12/1996 | |
| EP | 1538827 A1 | 6/2005 | |
| EP | 1939917 A2 | 7/2008 | |
| EP | 2088763 A2 | 8/2009 | |
| EP | 2346094 A1 | 7/2011 | |
| EP | 2975840 A1 | 1/2016 | |
| JP | H08241977 A | 9/1996 | |
| JP | H10171965 A | 6/1998 | |
| JP | H11153516 A | 6/1999 | |
| JP | 2002033473 | 1/2002 | |
| JP | 2004031452 A | 1/2004 | |
| JP | 2007086108 A | 4/2007 | |

(56) References Cited

FOREIGN PATENT DOCUMENTS

| JP | 2008096430 A | 4/2008 |
|---|---|---|
| JP | 2008224303 A | 9/2008 |
| JP | 2009117454 A | 5/2009 |
| JP | 5304674 B2 | 10/2013 |
| KR | 20020084541 A | 11/2002 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9600381 A1 | 1/1996 |
| WO | 9617372 A1 | 6/1996 |
| WO | 2007035858 A2 | 3/2007 |
| WO | 2008121232 A1 | 10/2008 |
| WO | 2011091159 A1 | 7/2011 |
| WO | 2014067754 A2 | 5/2014 |

OTHER PUBLICATIONS

Allen et al., Work Function, Photoelectric Threshold, and Surface . . . ; Physical Review, vol. 127, No. 1, Jul. 1, 1962, pp. 150-158.

Dulinski et al., Tests of a backside illuminated monolithic CMOS pixel . . . , Nuclear Instruments and Methods in Physics Research A 546 (2005) 274-280, 7 pgs.

Fanton et al, Multiparameter Measurements of Thin Film . . . , Journal of Applied Physics, vol. 73, No. 11, p. 7035 (1993).

Fu et al., Optimizing GaN photocathode structure for higher . . . ; Optik, vol. 123, No. 9, May 2012, pp. 756-768.

Hecht, Optics, Fourth Edition, India: Pearson Education Pte, Ltd. 2004.

Hecht, Optics, Second Edition, Adelphi University, 1987, Addison-Wesley Publishing Company, Inc., 3 pages.

Henderson, Brian S., Study of Negative Electron Affinity . . . , Dept. of Physics, Rice Univ., Aug. 7, 2009, 18 pgs.

Howorth et al., Transmission silicon photoemitters . . . , Jrnl of Physics D: Applied Physics, vol. 9, No. 5, Apr. 1, 1976, pp. 785-794.

Huang et al., Back-Side Illuminated Photogate CMOS . . . , IEEE Sensors Journal, vol. 11, No. 9, Sep. 2011, 5 pgs.

ISR and Written Opinion dated Mar. 31, 2014 for PCT/US2013/074124.

Itzler et al., InP-based Geiger-mode . . . , Proc. SPIE vol. 7320 (2000), 12 pgs.

Janesick, James R., Scientific Charge-Coupled Devices, SPIE Press, 2001, pp. 556-561.

KLA-Tencor Coporation, filed U.S. Appl. No. 62/059,368, filed Oct. 3, 2014 and entitled "183nm Laser and Inspection System".

Leng et al, Simultaneous Measurement of Six Layers . . . , Journal of Applied Physics, vol. 81, No. 8, p. 3570 (1997).

Lim, Seunghuyn, Low-Power Analog-to-Digital Converters for . . . ; Graduate School, Yonsei Univ. Dept. of EEE, Feb. 2010, pp. 16-21.

Martinelli, Ramon U., Infrared Photoemission from Silicon, Applied Physics Letters, vol. 16, No. 7, Apr. 1, 1970, pp. 261-262.

Martinelli, Ramon U., Reflection and Transmission Secondary Emission . . . , Applied Physics Letters, vol. 17, No. 8, Oct. 15, 1970, pp. 313-314.

Mouchart et al., Thin Film Optical Coatings. 7: Two Layer Coatings Close to Antireflection, Applied Optics, vol. 18, No. 8, Apr. 15, 1979, pp. 1226-1232.

Nanver et al., Pure-Boron Chemical-Vapor-Deposited Layers: a New Material for Silicon Device Processing, 18th IEEE International Conference on Advanced Thermal Processing of Semiconductors (RTP), Sep. 28, 2010-Oct. 1, 2010, pp. 136-139.

Nanver, Silicon Photodiodes for Low Penetration Depth Beams such as DUV/VUV/EUV Light and Low-Energy Electrons, Advances in Photodiodes, G. Betta, ed., Mar. 22, 2011, pp. 205-224, www.intechopen.com.

Niclass et al., Design and Characterization of a CMOS 3-D . . . , IEEE Journal Solid-State Circuits, vol. 40, No. 9, Sep. 2005, 8 pgs.

Nikzad, Shouleh et al., Delta-doped CCDs High QE with long-term stability . . . ; SPIE vol. 2198 (1994) pp. 907-915.

Paetzel et al., Activation of Silicon Wafer by Excimer Laser, 18th IEEE Conf. Advanced Thermal Processing of Semiconductors—RTP 2010, 5 pgs.

Raoult, Efficient generation of narrow-bandwidth . . . , Jul. 15, 1998, vol. 23, No. 14, Optics Letters, pp. 1117-1119.

Sarubbi et al., Chemical Vapor Deposition of α-Boron Layers on Silicon for Controlled Nanometer-Deep p+n Junction Formation, J. Electron. Mat., vol. 39, No. 2, Feb. 2010, pp. 162-173.

Sarubbi et al., Pure boron-doped photodiodes . . . IEEE, Sep. 15, 2008, pp. 278-281.

Sobieski, Stanley, Intensified Charge Coupled Devices for Ultra Low Light Level Imaging, NASA, Goddard Space Flight Center, SPIE vol. 78 (1976) Low Light Level Devices, pp. 73-77.

Stevanovic et al., A CMOS Image Sensor for High-Speed Imaging, 2000 IEEE int'l. Solid-State Circuits Conf., 3 pgs.

Tobin, Kenneth W., Inspection in Semiconductor Manufacturing, Webster's Encyclopedia of Electrical and Electronic Engineering, vol. 10, pp. 242-262, Wiley & Sons, NY, NY, 1999.

Vaillant, Joel et al., Int'l. Conf. on Space Optics, High performance UV antirelection coating for back thinned CCD and CMOS Image sensors, Oct. 4-8, 2010, 4 pgs.

Xiaogian, Fu, Higher Quantum Efficiency by Optimizing . . . 978-1-4244-6644-3/10 IEEE, pp. 234-235.

* cited by examiner

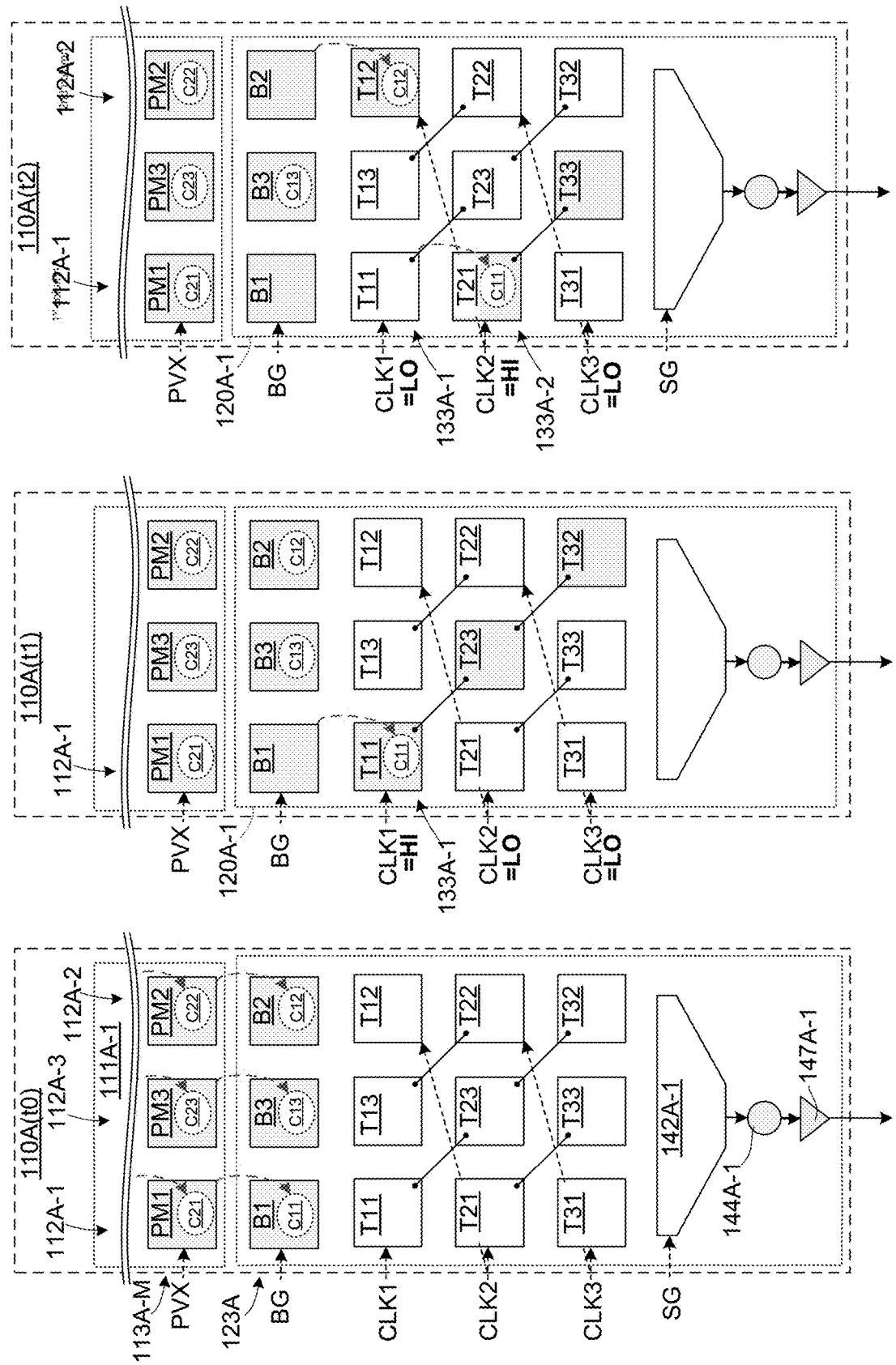

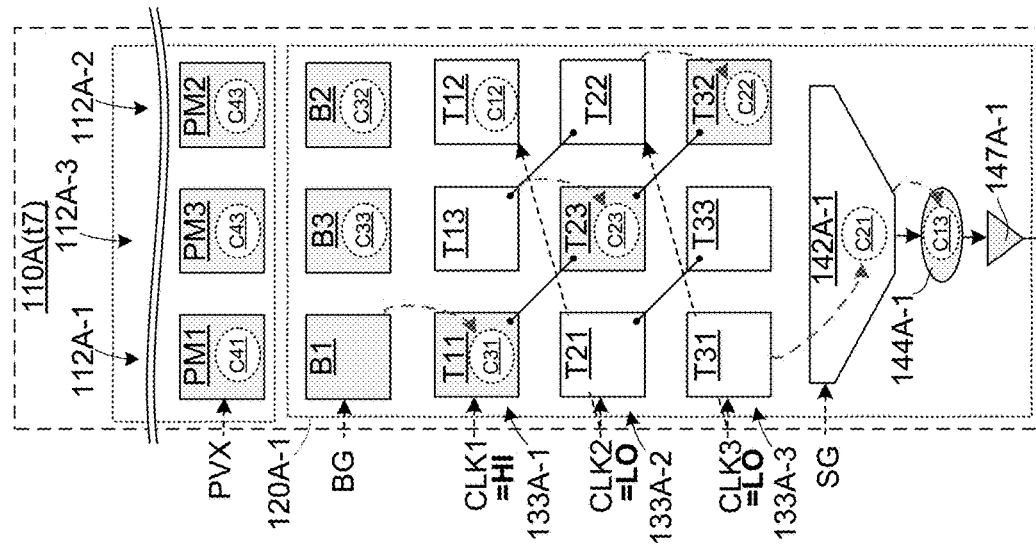
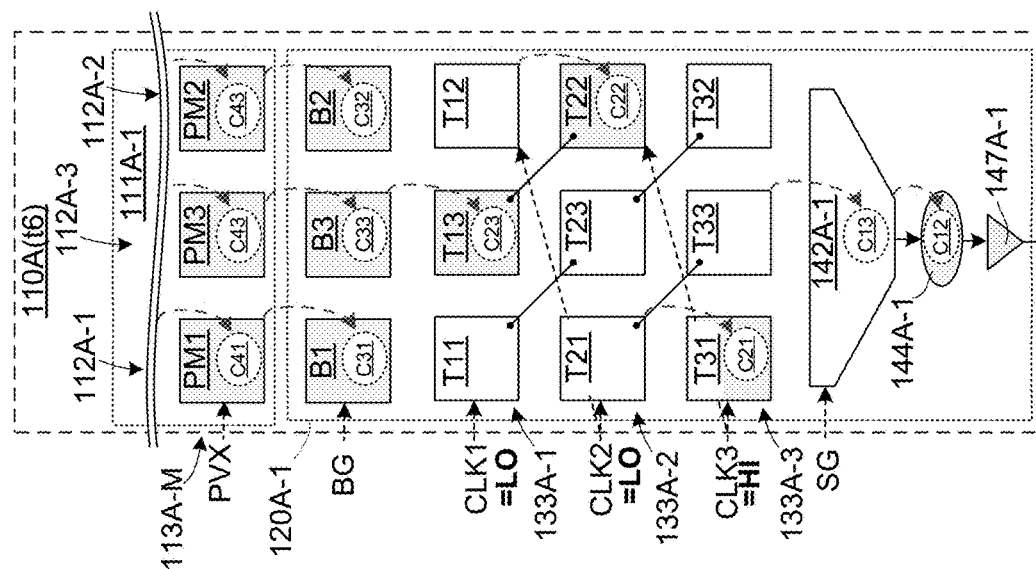

MULTIPLE COLUMN PER CHANNEL CCD SENSOR ARCHITECTURE FOR INSPECTION AND METROLOGY

PRIORITY APPLICATIONS

The present application is a continuation-in-part of U.S. patent application Ser. No. 16/397,072 filed Apr. 29, 2019 and entitled "Dual-Column-Parallel CCD Sensor And Inspection Systems Using A Sensor", which is a divisional of U.S. Pat. No. 10,313,622 issued Jun. 4, 2019 and entitled "Dual-Column-Parallel CCD Sensor And Inspection Systems Using A Sensor", which claims priority to U.S. Provisional Patent Application 62/319,130 filed Apr. 6, 2016 and entitled "Dual-Column-Parallel CCD Sensor And Inspection Systems Using A Sensor". The present application also claims priority to U.S. Provisional Patent Application 62/733,635 filed Sep. 20, 2018 and entitled "Three-Column Per Channel CCD Sensor Architecture For Inspection And Metrology", by Brown et al.

BACKGROUND OF THE DISCLOSURE

Field of the Disclosure

The present application relates to image sensors and associated electronic circuits suitable for sensing radiation at visible, UV, deep UV (DUV), vacuum UV (VUV), extreme UV (EUV) and X-ray wavelengths, and for sensing electrons or other charged particles, and to methods for operating such image sensors. The sensors and circuits are particularly suitable for use in inspection systems, including those used to inspect photomasks, reticles, and semiconductor wafers.

Related Art

The integrated circuit industry requires inspection tools that provide increasingly higher sensitivity to detect smaller defects and particles, while maintaining high throughput for a lower cost of ownership. The semiconductor industry is currently manufacturing semiconductor devices with feature dimensions around 20 nm and smaller. Within a few years, the industry will be manufacturing devices with feature dimensions around 5 nm. Particles and defects just a few nm in size can reduce wafer yields and must be captured to ensure high-yield production. Furthermore, efforts have been spent on speeding up inspection to cope with the transition from today's 300 mm wafers to 450 mm wafers in the near future. Thus, the semiconductor industry is driven by ever greater demand for inspection tools that can achieve high sensitivity at high speed.

An image sensor is a key component of a semiconductor inspection tool. It plays an important role in determining defect detection sensitivity and inspection speed. Considering their image quality, light sensitivity, and readout noise performance, CCDs are widely used as image sensors for semiconductor inspection applications. There are two fundamental ways to improve the sensitivity of CCD image sensors. The first one is to increase the amplitude of the signal, and the second one is to reduce the noise level. In the past decades, many efforts have been devoted in both ways. As various technologies, such as backside illumination, anti-reflection coatings, full depletion, and micro-lenses, have been developed, the sensitivity of CCD image sensors has been increased with advancement of quantum efficiency and thereby improvement in signal intensity.

CCD image sensors suffer from three major types of noise, namely shot noise, dark-current noise, and read noise. The photons incident on an image sensor carry time-dependent fluctuations in the photon flux. The image sensor exhibits lower shot noise, the statistical variations in the incident photon flux, when it uses pixel binning and/or frame averaging because then there will be more collected photons per output pixel. Dark current is generated by the thermal excitation of charge carriers into the conduction band within the silicon of an image sensor. CCD cooling, Multi-Pinned-Phase (MPP), and/or dark image subtraction techniques have suppressed the dark-current noise to such a level that its contribution is negligible over the short exposure times (typically a few to hundreds of milliseconds) used in high-speed inspection. Read noise arises from the on-chip electronics and can be reduced by carefully designed electronics and image processing techniques.

As readout speed increases, read noise becomes the dominant noise factor limiting the sensitivity of a CCD image sensor. The CCD on-chip amplifier requires high bandwidth to measure the signal (image) charge in each pixel at a high pixel clock rate. Read noise increases as the result of the high bandwidth. Conventional full-frame CCD image sensors employ a serial-readout architecture, thus demanding a high pixel clock rate (such as 20 MHz or higher) and high readout speed. It is difficult or impossible to reduce the read noise at such high speeds. As pixel sizes on the article being inspected are reduced in order to detect smaller defects (for example, by increasing the optical magnification of the image), increased readout speed is needed to maintain overall inspection speed (e.g. to keep the number of wafers inspected per hour approximately constant as the image pixel size decreases). This means that read noise will tend to increase rather than decrease.

Column-Parallel CCD (CPCCD) image sensors are known in the art. Each column of CPCCD pixels is equipped with an amplifier that facilitates parallel readout of each image charge. See, for example, J. R. Janesick, "Scientific charge-coupled devices", 2001, SPIE, p 60. The column-parallel readout eases the requirements for pixel clock rate and can help reduce read noise at high readout speed. However, it is only practical to implement a column-parallel readout architecture for large-pixel CCD designs (such as pixel widths of more than 30 μm). In the case of a CCD sensor with a small column pitch (such as a pitch between about 6 μm and about 25 μm, which is best suited to high-speed semiconductor inspection applications), the one-amplifier-per-column layout cannot be implemented due to space constraints. Furthermore, a column parallel design requires that all outputs be clocked simultaneously. That results in high switching currents and high read noise.

Therefore, a need arises for providing a CCD image sensor that facilitates high-sensitivity and high-speed operation of an inspection system and overcomes some, or all, of the above disadvantages.

SUMMARY OF THE DISCLOSURE

The present invention is directed to multiple-column-per-channeler-channel CCD image sensors and an associated readout method that facilitates both high-sensitivity and high-speed readout operations by way of utilizing a novel readout circuit to coordinate the high-speed transfer of charges generated in associated groups of adjacent pixel columns to a single (shared) floating diffusion for readout by a single (shared) amplifier. This one-amplifier-per-two-or-more-columns arrangement facilitates the production of CCD sensors with small column pitches (e.g., between about 6 μm and about 25 μm) that are suitable for high-speed semiconductor inspection applications by way of avoiding the high switching currents, high read noise, and the amplifier space problems associated with one-amplifier-per-column CPCCD sensors. Moreover, the one-amplifier-per-multiple-columns (i.e., multiple-columns-per-channel, also referred to below as N-columns-per-channel) arrangement is implemented using an output clock rate of a summing gate control signal that is multiple-times (e.g., 2×, 3× or 4×) the line clock rate speed, thereby avoiding both the high pixel clock rate issues associated with conventional CPCCD sensors, and also avoiding the high read noise problems associated with serial readout approaches.

According to a specific embodiment of the invention, a three-column-per-channel CCD image sensor includes an array of pixels arranged in parallel columns, and a novel readout circuit includes multiple readout structures respectively coupled to receive image data from an associated group of columns. Each readout structure includes three rows of transfer gates operably coupled to receive image charges from the associated group of columns, a shared summing gate coupled to alternately receive image charges passed from the transfer gates, and an output circuit including a single amplifier configured to generate output voltage signals based on the image charges transferred from the associated group of columns. According to an aspect of the present invention, the three rows of transfer gates in each group of associated columns are operably coupled such that a (first) transfer gate control signal applied to a first-row (first) transfer gate in one column is substantially simultaneously applied to a (fourth) transfer gate in the associated second column, and such that a second transfer gate control signal applied to a first-row (second) transfer gate in the second column is substantially simultaneously applied to a (third) transfer gate in the first column. According to another aspect, the summing gate of each readout structure is configured to receive respective image charges from the three third-row transfer gates during three different time periods, and is configured to pass each respectively received image charge to an output circuit (e.g., a floating diffusion coupled to an amplifier) in accordance with one or more summing gate control signals. Coupling the transfer gates in adjacent columns and utilizing a shared summing gate in this manner facilitates efficient and reliable transfer of image charges from three or more columns of pixels to one shared output circuit with low noise and at a reasonable clock rate (i.e., three or more times the line clock rate), thereby facilitating the production of image sensors particularly suitable for use in inspection systems, including those used to inspect photomasks, reticles, and semiconductor wafers.

According to another embodiment, an image sensor is fabricated on a semiconductor substrate (e.g. monocrystalline silicon) having formed therein multiple symmetrical fork-shaped buried diffusions, each having parallel upstream (first, second and third) elongated portions, a downstream (fourth) elongated portion in which the sense node (i.e., floating diffusion) is formed, and an intervening (fifth) V-shaped merge section connecting the three upstream elongated portions to the downstream elongated portion. The upstream elongated portions respectively define the associated columns mentioned above. Polycrystalline silicon pixel gate structures are formed over the upstream elongated portions, thereby forming pixels that serve to generate image charges and buffer cells that serve to transfer the image charges along the three associated columns toward the V-shaped merge section. Three rows of transfer gates are generated by polycrystalline silicon transfer gate structures formed over portions of the upstream (first, second and third) elongated portions, thereby forming three transfer gates configured to transfer image charges along each column toward the V-shaped merge section. A summing gate is formed by way of a polycrystalline silicon gate structure disposed over the V-shaped merge section and configured to receive image charges from the three associated columns of each channel by way of the three upstream elongated portions, and configured to pass the receive image charges to the downstream elongated section. As in the embodiment described above, the transfer gate electrodes in the three rows of transfer gates are effectively coupled to facilitate efficient and reliable transfer of image charges from the three associated columns to the summing gate, and the summing gate is controlled by a summing gate control signal to pass the image charges from the three associated columns to the shared output circuit with low noise and at a reasonable clock rate (i.e., three times the line clock rate). By utilizing symmetrical fork-shaped buried diffusions in combination with the coupled transfer gates and summing gates to transfer image charges to an sense node (e.g., a shared floating diffusion disposed in the downstream elongated diffusion portion), the present invention facilitates the highly efficient, high speed and low noise transfer of image charges from two columns of pixels for output using a single amplifier controlled or otherwise operably coupled to the floating diffusion. Since the transfer gates of adjacent columns switch alternately, the clock signals to the transfer gates are approximately balanced and generate minimal substrate currents thus allowing high-speed clocking while maintaining a low noise level. Since each output circuit is connected to three columns, in contrast to a conventional high-speed CCD that might have 12, 16 or more columns per output, the pixel clock rate in image sensor is only three times the line clock rate instead of 12, 16 or more times the line clock rate. Since noise increases with a higher bandwidth, an image sensor with a lower pixel clock rate can be less noisy than one with higher pixel clock rate.

According to a specific embodiment, cross-coupling of associated polycrystalline silicon transfer gate structures disposed in the two different rows is achieved by conductive (e.g., metal or doped polycrystalline silicon) linking structures connected between the three associated transfer gate structures. That is, a (first) transfer gate structure disposed in the first row of one column is electrically connected by way of a (first) conductive linking structure to a (fifth) transfer gate structure disposed in the second row of the associated third column, and also connected by way of a (second) conductive linking structure to a (third) transfer gate structure disposed in the third row and second column. This arrangement facilitates reliable control over the three associated transfer gate structures by applying the associated transfer gate control signal to the (first) transfer gate structure, whereby the transfer gate control signal is substantially simultaneously applied to the two associated transfer gate structures (i.e., by way of transmission over the (first) conductive linking structures). In one embodiment, the conductive linking structures are implemented using polycrystalline silicon, where the three associated transfer gate structures and the conductive linking structure are fabricated as an integral step-shaped composite polycrystalline silicon structure This embodiment avoids the extra complexity, cost and potential reduced yield associated with using two layers of metal interconnections, or alternatively allows a second layer of metal to be used to reduce the series resistance of the clock signals enabling higher speed operation.

According to another specific embodiment, the summing gate is implemented using a tapered polycrystalline silicon structure having an upstream edge (i.e., the edge facing the upstream elongated diffusion portions) that is longer than its downstream edge (i.e., the edge facing the downstream elongated diffusion portion). The tapered summing gate structure facilitates efficient transfer of image charges from the upstream elongated diffusion portions to the downstream elongated diffusion portion. In a preferred embodiment, a similarly tapered output gate structure is disposed over a downstream portion of the V-shaped merge section (i.e., between the summing gate structure and the downstream elongated diffusion portion), and functions to prevent charge spill from the sense node back to the summing gate.

According to another specific embodiment, the shared output circuit of each associated column group includes a floating diffusion formed in the downstream (fourth) elongated diffusion portion, and an on-chip pre-amplifier that is operably coupled to the floating diffusion by way of a conductive (metal or polycrystalline silicon) structure. In one embodiment, the conductive structure is implemented using a polycrystalline silicon structure that is formed and patterned such that a lower/vertical poly portion extends through a contact hole to the floating diffusion, and an upper/horizontal poly portion extends horizontally from the lower/vertical poly portion and forms the gate structure for a first-stage gain transistor of the on-chip pre-amplifier. This arrangement facilitates self-alignment of the floating diffusion and the polysilicon gate structure and facilitates connection to the pre-amplifier without the need for a metal interconnect, thereby further reducing noise and floating diffusion capacitance and increasing charge conversion efficiency, thus improving the sensor's signal-to-noise ratio.

An inspection method utilizing the multiple-column-per-channel CCD sensor of the present invention includes directing and focusing radiation onto the sample and receiving radiation from the sample and directing received radiation to a CCD image sensor. The received radiation may include scattered radiation or reflected radiation. The CCD sensor incorporates a N-column-per-channel readout structure comprising N rows of transfer gates, a common summing gate, a floating diffusion (also known as a sense node), and an amplifier per group of columns. The N-column-per-channel readout structure is implemented in a way that all the columns have identical charge transfer and signal readout paths. In one embodiment, the N-column-per-channel CCD may use a self-aligned floating diffusion with a polysilicon contact connected to the amplifier. In another embodiment the N-column-per-channel CCD may comprise metal interconnects in the readout structure with equalized channel response and minimized crosstalk.

The method of inspecting can further include generating clock voltage waveforms and controlling the timing of the on-chip N-column-per-channel readouts and the off-chip signal processing circuits for appropriate synchronization of the sensor readout and digitization of the output signals. Exemplary clock voltage waveforms and timing configurations used to drive an exemplary three-column-per-channel configuration as an example to explain some of the possible methods for synchronization of the sensor output. The clock driving schemes may be implemented by an apparatus including an analog-to-digital converter (ADC), a digital signal processor, a clock driver, and external processing, storage, and control circuitry.

A system for inspecting a sample is also described. This system includes an illumination source, a light detection device, optics configured to direct light from the illumination source to the sample and to direct light outputs or reflections from the sample to the device, and a driving circuit. In one embodiment, the light detection device may comprise a CCD array sensor, such as a Time Delay Integration (TDI) sensor. In another embodiment, the device may comprise a CCD line sensor. The CCD sensor incorporates a N-column-per-channel readout structure comprising, per group of N associated columns, N×N transfer gates, a common summing gate, a floating diffusion, and an amplifier. Each column of the CCD pixels is terminated by a N transfer gates. Each group of N associated columns combine into a common summing gate, and the common summing gate tapers towards a small floating diffusion where an amplifier converts each image charge to a corresponding output voltage signal. The N-column-per-channel readout structure is implemented in a way that all the columns have substantially identical charge transfer and signal readout path characteristics. The driving circuit supplies bias voltages and clock signals to the on-chip N-column-per-channel readout structure and off-chip signal processing circuits in order to read the sensor output with the desired timing.

In one embodiment, the CCD sensor may further comprise a semiconductor membrane. In another embodiment, the semiconductor membrane may include circuit elements formed on a first surface of the semiconductor membrane and a pure boron layer deposited on a second surface of the semiconductor membrane. In yet another embodiment, the system may include multiple CCD sensors.

The sample may be supported by a stage, which moves relative to the optics during the inspection. The electrical charges may be read out from the sensor in synchrony with the motion of the stage.

The exemplary inspection system may include one or more illumination paths that illuminate the sample from different angles of incidence and/or different azimuth angles and/or with different wavelengths and/or polarization states. The exemplary inspection system may include one or more collection paths that collect light reflected or scattered by the sample in different directions and/or are sensitive to different wavelengths and/or to different polarization states.

BRIEF DESCRIPTION OF THE DRAWINGS

FIGS. 4A, 4B, 4C, 4D, 4E, 4F, 4G and 4H illustrate a portion of the exemplary three-column-per-channel CCD sensor of FIG. 3A during operation.

DETAILED DESCRIPTION OF THE DRAWINGS

The present invention relates to an improvement in sensors for semiconductor inspection systems. The following description is presented to enable one of ordinary skill in the art to make and use the invention as provided in the context of a particular application and its requirements. As used herein, directional terms such as "top", "bottom", "over", "under", "underneath", "left", "right", "vertical", "horizontal" and "down" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
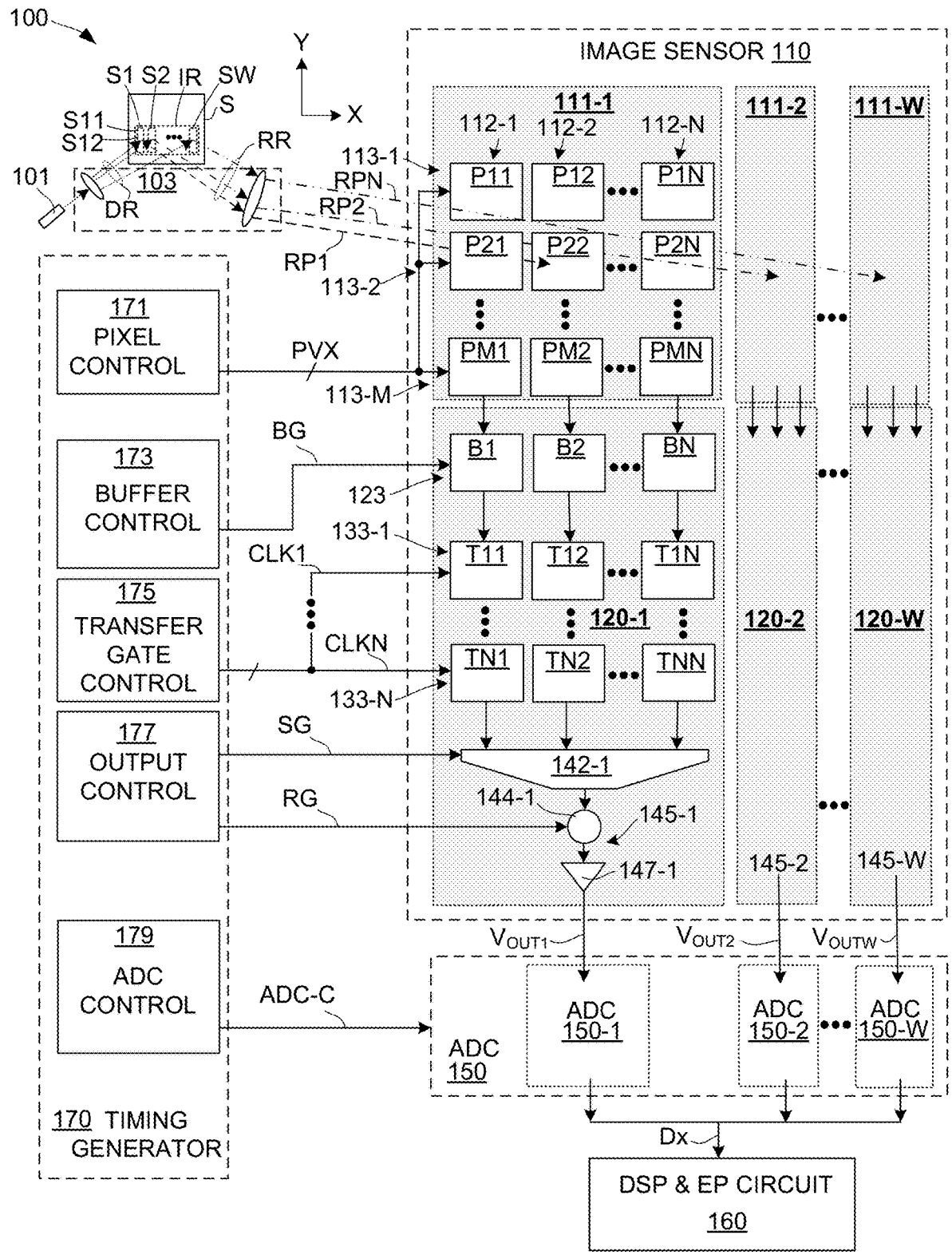
FIG. 1 illustrates a multiple-column-per-channel CCD sensor having an architecture for inspection and metrology according to a generalized embodiment of the present invention.

FIG. 1 is a block diagram depicting a simplified system 100 for inspecting a sample S using a multiple-column-per-channel charge-coupled-device (CCD) image sensor 110 and an analog-to-digital converter (ADC) 150 according to a generalized embodiment of the present invention. System 100 includes a radiation source 101 (e.g., a laser) and an optical system 103 configured to direct emitted radiation DR onto sample S, and configured to direct received (e.g., reflected) radiation RR from an imaged region IR of sample S onto image sensor 110. As explained below, image sensor 110 generates analog output signals $V_{OUT1}$ to $V_{OUTW}$ that are converted into digital image data values Dx by ADC 150. System 100 also includes a digital signal processing (DSP) and external processing (EP) circuit 160 that receive and processes digital image data values Dx from ADC 150, and a timing generator circuit 170 that generates clock, reset and control signals utilized to control the operations of image sensor 110 and ADC 150. Those skilled in the art will recognize that the operation of system 100, which is described below with reference to certain exemplary embodiments, is greatly simplified herein for brevity.

Referring to the upper right portion of FIG. 1, image sensor 110 includes an array of pixels arranged in multiple pixel groups 111-1 to 111-W, and optical system 103 is configured such that portions of received radiation RR received from sections S1 to SN of imaged region IR are respectively directed onto corresponding pixel groups 111-1 to 111-W of image sensor 110. Each pixel group 111-1 to 111-W includes multiple (M×N) pixels disposed in multiple (M) rows 113-1 to 113-M and multiple (N) columns 112-1 to 112-N, where the term "multiple" is defined herein to mean two or more. For example, pixel group 111-1 includes M horizontally-aligned rows of pixels, where pixels P11, P12 . . . P1N collectively form (define) an associated top row 113-1 of pixels, and pixels PM1, PM2 . . . PMN define an associated bottom (edge) row of pixels. Similarly, pixel group 111-1 includes N vertically-aligned columns of pixels, where pixels P11, P21 . . . PM1 define an associated leftmost column 112-1, and pixels P1N, P2N . . . PMN define an associated rightmost column 112-N. Note that the three-dot symbols provided in image sensor group 111-1 are intended to indicate that each pixel group 111-1 to 111-W includes multiple rows and multiple columns—in exemplary practical image sensors disclosed herein that are considered useful in high-speed inspection applications, each pixel group would typically comprise three or more columns of pixels and between one row (i.e., as in a line sensor) and several thousand rows of pixels. Each pixel group 111-2 to 111-W is understood including the same number of pixels as that included in pixel group 111-1.

The pixels of pixel groups 111-1 to 111-W are configured in cooperation with optical system 103 to capture and store corresponding analog image data values (charges) having values (charge amounts) determined by the amount of radiation received from a corresponding section of imaged region IR during each imaging operation performed by system 100. For example, at a given moment when imaged region IR is oriented relative to sample S as shown in FIG. 1, each pixel Pll to PMN of pixel group 111-1 captures and stores an image data value (charge) received by way of radiation portion RP1 from a corresponding imaged region section S1 (e.g., the portion of sample S disposed in the leftmost portion of imaged region IR), thereby causing pixels P11 to PMN to capture and store a corresponding charge in the manner described below. At the same time, the pixels of pixel group 111-2 store image data received by way of radiation portion RP2 from a corresponding imaged region section S2, which is adjacent to section S1. In this way, radiation received from each section S1 to SW of imaged region IR is thereby captured by a corresponding pixel group 111-1 to 111-W of image sensor 110 such that the pixels of image sensor 110 capture image data from the entire portion of sample S disposed within imaged region IR. Similarly, the pixels of each pixel group store image data received from a corresponding sub-section of each imaged region section.

According to a presently preferred embodiment, system 100 performs scanning-type inspection operations during which sample S undergoes a scanning movement (i.e., is translated or moved) relative to optical system 103 and image sensor 110 while directed radiation DR is directed onto sample S and received radiation RR is directed to image sensor 110. In one embodiment, sample S is moved (e.g., using an X-Y table) in a downward (negative Y-axis) direction relative to radiation source 101, optical system 103 and image sensor 110, which are maintained in a stationary (fixed) position during each scanning-type inspection operation. In another embodiment, sample S is maintained in a stationary position while radiation source 101, optical system 103 and image sensor 110 are moved in an upward (Y-axis) direction relative to sample S. As explained below, charges stored in image sensor 110 are shifted in a synchronized manner such that captured image data from sample S is transferred from pixel to pixel along the columns of pixels of image sensor 110 in coordination with the scanning movement of sample S.

Figure 2A:
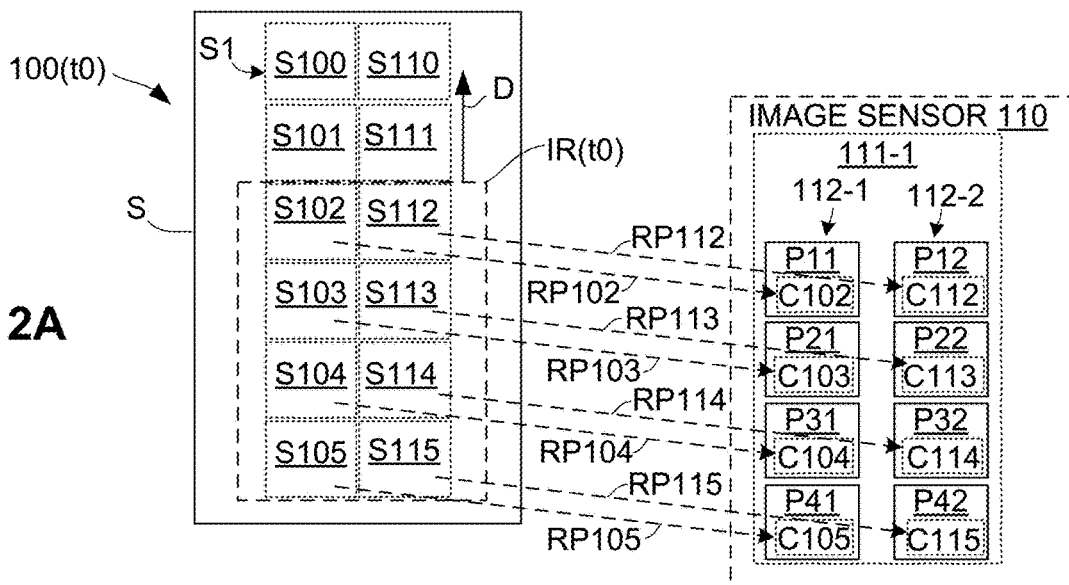
FIGS. 2A, 2B and 2C are partial block diagrams depicting simplified image capture and image transfer operations performed by the CCD sensor of FIG. 1 during a sample inspection operation according to an exemplary embodiment of the present invention.
Figure 2B:
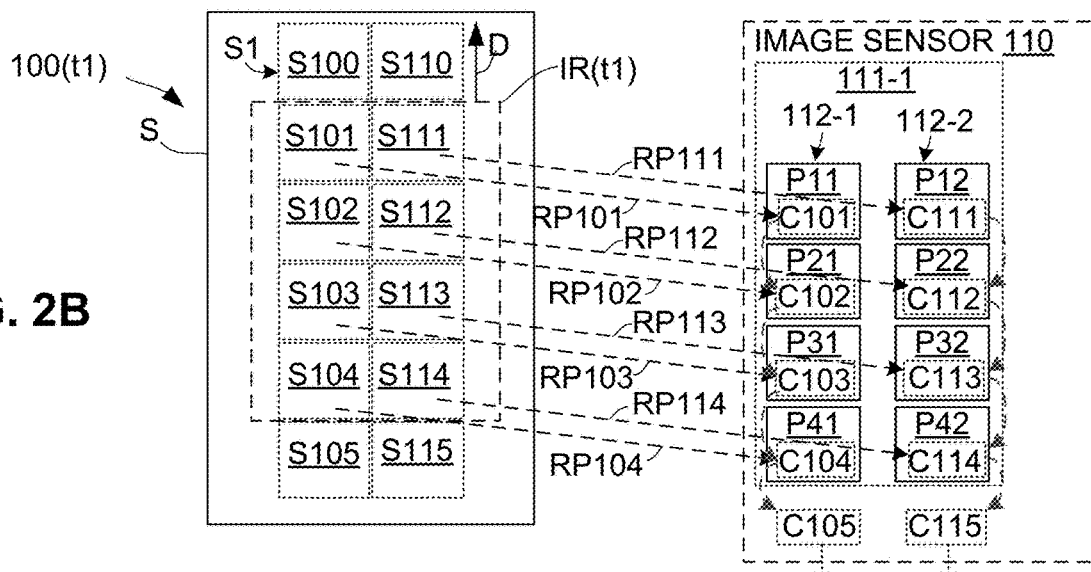
Figure 2C:
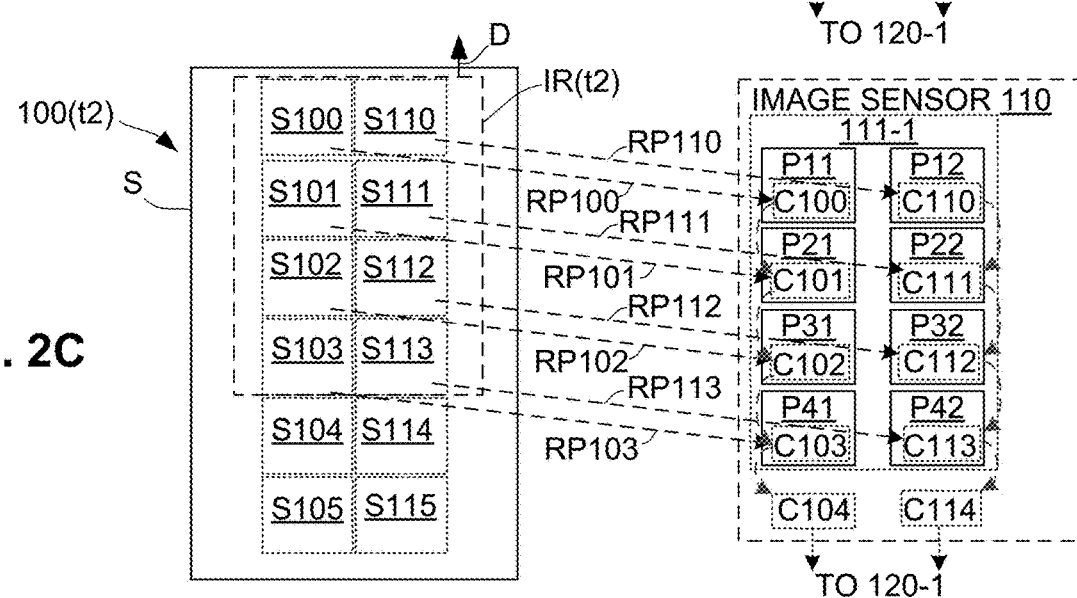

FIGS. 2A to 2C depict the synchronized movement of sample S and the charges stored in image sensor 110 during an exemplary simplified scanning-type inspection operation. FIGS. 2A to 2C show representative portions of system 100 (FIG. 1) at sequential times t0, t1 and t2 (indicated by "100(t0)", "100(t1)" and "100(t2)" in FIGS. 2A to 2C, respectively. Each of these figures shows an enlarged section S1 of sample S and eight pixels P11 to P24 disposed in the top four rows of the leftmost two columns 112-1 and 112-2 of pixel group 111-1 of image sensor 110 (other portions of sample S and system 100 are omitted for brevity and clarity). For explanatory purposes, section S1 of sample S is divided into sub-sections S100 to S115, which correspond to adjacent minute regions of sample S.

FIG. 2A shows system 100 at an initial time t0 when the optical system (not shown) is positioned relative to sample S such that imaged region IR(t0) encompasses sub-sections S102 to S115 of section S1. As explained above, at this time radiation from sections S102 to S115 is directed to pixel group 111-1 by way of radiation (light) portions RP102 to RP115, whereby pixels P11 to P24 respectively capture/store charges C102 to C115 based on the amount of received light from sub-sections 5102 to S115. That is, pixels P11 to P24 of pixel group 111-1 receive corresponding light portions RP102 to RP115 reflected/emitted from corresponding sub-sections of section S1 of sample S, whereby each pixel receives and stores a corresponding charge C102 to C115 having an amount determined by the amount of radiation received during time period t0. For example, pixel P11 captures received radiation portion RP102 from sub-section S102 of sample S and generates/stores a corresponding charge C102 having a charge level that increases by the amount of received radiation received during period t0. Similarly, pixel P12 generates/stores charge C112 in accordance with a radiation amount associated with radiation portion R112 received from sub-section S112 during period t0, pixel P21 generates/stores charge C103 generates/stores charge C103 in accordance with radiation portion R103 received from sub-section 5103 during period t0, etc.

FIG. 2B shows system 100(t1) after movement of sample S relative to the optical system (not shown) causes imaged region IR(t1) to move incrementally upward (i.e., in direction D) relative to sample S, whereby imaged region IR(t1) encompasses sub-sections S101 to S114 of section S1. Referring to the right side of FIG. 2B, at the same time imaged region IR is moved incrementally in direction D, and image sensor 110 is simultaneously driven (i.e., controlled by way of line clock signals PV1, PV2 and PV3) such that the analog image data values (i.e., charges C102 to C115) are generated and systematically transferred along columns 112-1 and 112-2 from pixels P11 to P24 toward an output sensing node (described below). Specifically, as imaged region IR(t1) shifts to encompass sub-sections S101 to S114, image sensor 110 is driven to shift charges C102 to C115 downward, whereby charges C102 to C114 are shifted along column 112-1 from pixels P11-P31 to pixels P21-P41 and charges C112 to C114 are shifted along column 112-2 from pixels P12-P32 to pixels P22-P42 (as indicated by the curved dashed arrows in FIG. 2B), and charges C105 and C115 are shifted either to a subsequent pair of pixels or out of pixel group 111-1 to readout circuit 120-1. Note that the downward shifting rate of charges C102 to C114 is coordinated (synchronized) with the movement rate of imaged region IR(t1) such that each of these charges continues to be influenced by radiation received from the same sub-section of sample S during period t1. That is, charge C102, which is stored in pixel P21 during period t1, is influenced by radiation portion RP102 transmitted from sub-section S102 during period t1. Note also that sub-sections S101 and S111, which are effectively added to imaged region IR(t1) by way of movement of optics 103 (FIG. 1), transmit radiation portions RP101 and RP111, respectively, that are transmitted by way of the optical system to pixels P11 and P12 during period t1.

FIG. 2C shows system 100(t2) after an additional incremental movement in direction D of the imaged region IR of sample S relative to the optical system (not shown) causes imaged region IR(t2) encompass sub-sections S100 to S113 of section S1. Similar to that shown in FIG. 2B, image sensor 110 is driven to systematically transfer charges C101 to C113 downward from pixels P11 to P24. By continuously driving image sensor 110 in coordination with movement of the optical system relative to the sample in the manner described above with reference to FIGS. 2A to 2C, analog image data is continuously captured during the scanning-type inspection operation performed by system 100.

In alternative embodiments, the above-mentioned shifting of charged along columns 112-1 and 112-2 may be accomplished using three-phase line control signals PV1, PV2 and PV3, as indicated in FIG. 1, or may be accomplished using two-phase line control signals. An advantage of a sensor configured with three-phase line control signals is that charge may be moved in either direction by generating line control signals PV1 to PV3 using alternative sequences that are known in the art, whereas two-phase line control signals can only move the charges in one direction. In another alternative embodiment, an image sensor using three-phase line control signals may be configured with buffer, transfer and output circuits at both the top and bottom of the pixel array to enable readout of the signal in either direction (i.e., by way of a second ADC circuit and a second DSP/EP circuit). Depending on whether single direction or bidirectional transfer is required, system 100 may use two-phase or three-phase line control signals.

Referring again to FIG. 1, image sensor 110 also includes readout circuits 120-1 to 120-W, where each readout circuit (e.g., readout circuit 120-1) includes an optional row of buffer cells 123, a plurality of transfer (shift register) gates T11 to TNN arranged in rows 133-1 to 133-N, a summing gate 142-1 that is operably coupled to the transfer gates of last transfer gate row 133-N, and an output circuit (sensing node) 145-1 including a floating diffusion 144-1 and an amplifier 147-1 that are operably coupled to summing gate 142-1 and configured to generate and transmit analog image data values $V_{OUT1}$ to ADC 150. Note that each readout circuit 120-1 to 120-W is operably coupled to an associated pixel groups 111-1 to 111-W of the generalized embodiment such that output circuits/sense nodes 145-1 to 145-W respectively generate and transmit analog image data values $V_{OUT1}$ to $V_{OUTW}$ to corresponding portions 150-1 to 150-W of ADC 150. As described below, the charges that move along each column of pixels of image sensor 110 are transferred to specific charge storage cells and shift registers before reaching the output circuits/sense nodes. Accordingly, the buffer cells and transfer gates of each readout circuit 120-1 to 120-W are referred to as being part of a corresponding column of associated pixel groups 111-1 to 111-W. For example, charge storage cell B1 and shift registers T11 and TN1 of readout circuit 120-1 are referred to as part of the leftmost column 112-1 of pixel group 111-1, which includes pixels P11, P21 and PM1.

Buffer cells B1 to BN of readout circuit 120-1 respectively includes at least one row 123 of N charge storage (buffer) cells that are controlled by one or more buffer cell signals BG to receive and buffer (temporarily store) analog image data values (charges) transferred in parallel (i.e., simultaneously) from an edge (bottom) row 113-M of pixels in associated pixel groups 111-1 to 111-W. For example, upon each assertion of buffer cell signal BG, each buffer cell B1, B2 . . . BN of readout circuit 120-1 respectively receives a charge from corresponding pixels PM1, PM2 . . . PMN disposed in a lowermost (edge) row 113-N of pixel group 111-1. In some embodiments, the buffer cells may be omitted, whereby charges are transferred from the edge row of pixels directly to the uppermost shift register elements of transfer circuits 130-1 to 130-W.

Transfer circuits 130-1 to 130-W include shift registers (storage cells) T11 to TNN that are disposed in columns 112-1 to 112-N and arranged in N transfer gate rows 133-1 to 133-N and controlled by transfer clock signal CLK1 to CLKN. In a preferred embodiment, the number of transfer gate rows 133-1 to 133-N and the number of transfer clock signal CLK1 to CLKN is equal to the number (N) of columns 112-1 to 112-N disposed in each associated pixel group 111-1 to 111-W (e.g., when each pixel group includes three columns, three rows of transfer gates are provided and controlled by three transfer clock signals). The N transfer gates in each column are respectively controlled by one of the N transfer clock signals such that an image charge received by an uppermost transfer gate from an associated buffer cell is sequentially passed along the vertically arranged transfer gates to a lowermost transfer gate. For example, in column 112-1, an image charge is received and stored by uppermost transfer gate T11 from associated buffer cell B1 in response to assertion of transfer clock signal CLK1, and the image charge is then sequentially passed along transfer gates disposed in column 112-1 until it is received and stored by transfer gate TN1 in response to assertion of transfer clock signal CLKN. The operation of transfer gates T11 to TNN is described in additional detail below.

Figure 8:
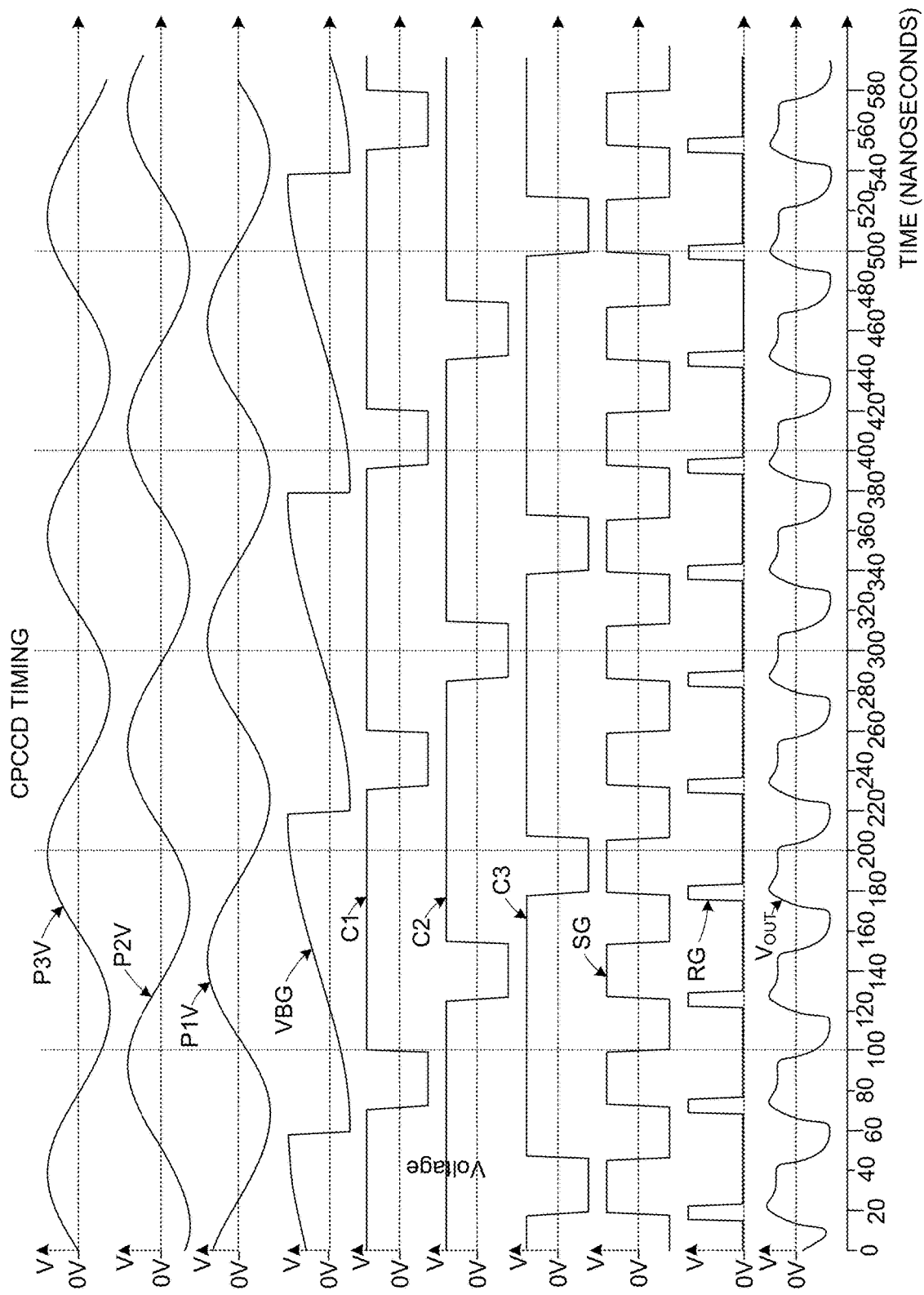
FIG. 8 illustrates exemplary voltage waveforms and timing configurations of clock signals to drive the on-chip three-column-per-channel readouts and off-chip signal processing circuits in accordance with another exemplary embodiment of the present invention.

Each readout structure of sensor 110 includes a shared summing gate that receives image charges from the associated group of transfer gates, and in turn passes the image signals to an associated sense node in accordance with a summing gate control signal SG. For example, readout structure 120-1 includes shared summing gate 142-1 configured to receive image from transfer gates TN1 to TNN in lowermost (edge) row 133-N, and to pass the image signals to an output circuit 145-1 including a floating diffusion (sense node) 144-1 and an amplifier 147-1. With this arrangement, as an image charge moves down column 112-1, transfer gates T11 to TN1 control the transfer of the image charge from pixel PM1 into the common summing gate 142-1. Transfer gates T12 to TN2 and T13 to TN3 perform a similar function for columns 112-2 and 112-3, respectively. Summing gate 142-1 sequentially receives image charges passed along columns 112-1, 112-2 and 112-3 without adding noise during charge transfer, and sequentially passes the image charges to floating diffusion 144-1, which is configured to collect and store the image charge for readout by way of amplifier 147-1, which converts image charge to voltage and transmits buffered voltage to ADC 150. ADC 150 includes multiple analog-to-digital converter units 150-1 to 150-W that respectively convert analog output signals $V_{OUT1}$ to $V_{OUTN}$ into corresponding digital output values Dx that are then transferred to DSP/EP circuit 160 for processing and storage using known techniques. The image charge transfer operation is described below with reference to a three-column-per-channel sensor, and exemplary voltage waveforms and timing configurations of the above clock/control signals are depicted in FIG. 8.

Timing generator 170 includes a pixel control circuit 171, a pixel buffer control circuit 173, a transfer gate control circuit 175, an output control circuit 177, and an ADC control circuit 179, where each of these control circuits is configured using known circuit design techniques to generate one or more of the clock/control signals utilized to operate sensor 110 in the manner described below. For example, pixel control circuit 171 generates two-or-more line control signals PVX that control the image capture and charge shifting operations of pixel groups 111-1 to 111-W in the manner described below. In a similar manner, buffer control circuit 173 generates buffer control signal BG that controls the charge buffering operations of buffer circuits B1 to BN, transfer gate control circuit 175 generates transfer gate control signals CLK1 to CLKN that control the operation transfer gates T11 to TNN in the manner described below, output control circuit 177 generates output circuit clock signal SG and reset gate control signal RG that control the operation of summing gate 142-1 and output circuit 145-1 as described below, and ADC control circuit 179 generates an ADC clock signal ADC-C that controls the timing of analog-to-digital conversion operations of ADC circuits 150-1 to 150-W, whereby final image data values Dx are generated and transmitted to DSP & EP circuit 160 for storage and/or processing. Those skilled in the art will recognize that the various control circuits and control signals depicted in FIG. 1 are greatly simplified for purposes of description, and that the functions and control signals utilized in the description below are utilized solely for purposes of describing the present invention, and are not intended to limit the appended claims unless otherwise specified in the claims.

Figures 3A, 3B:
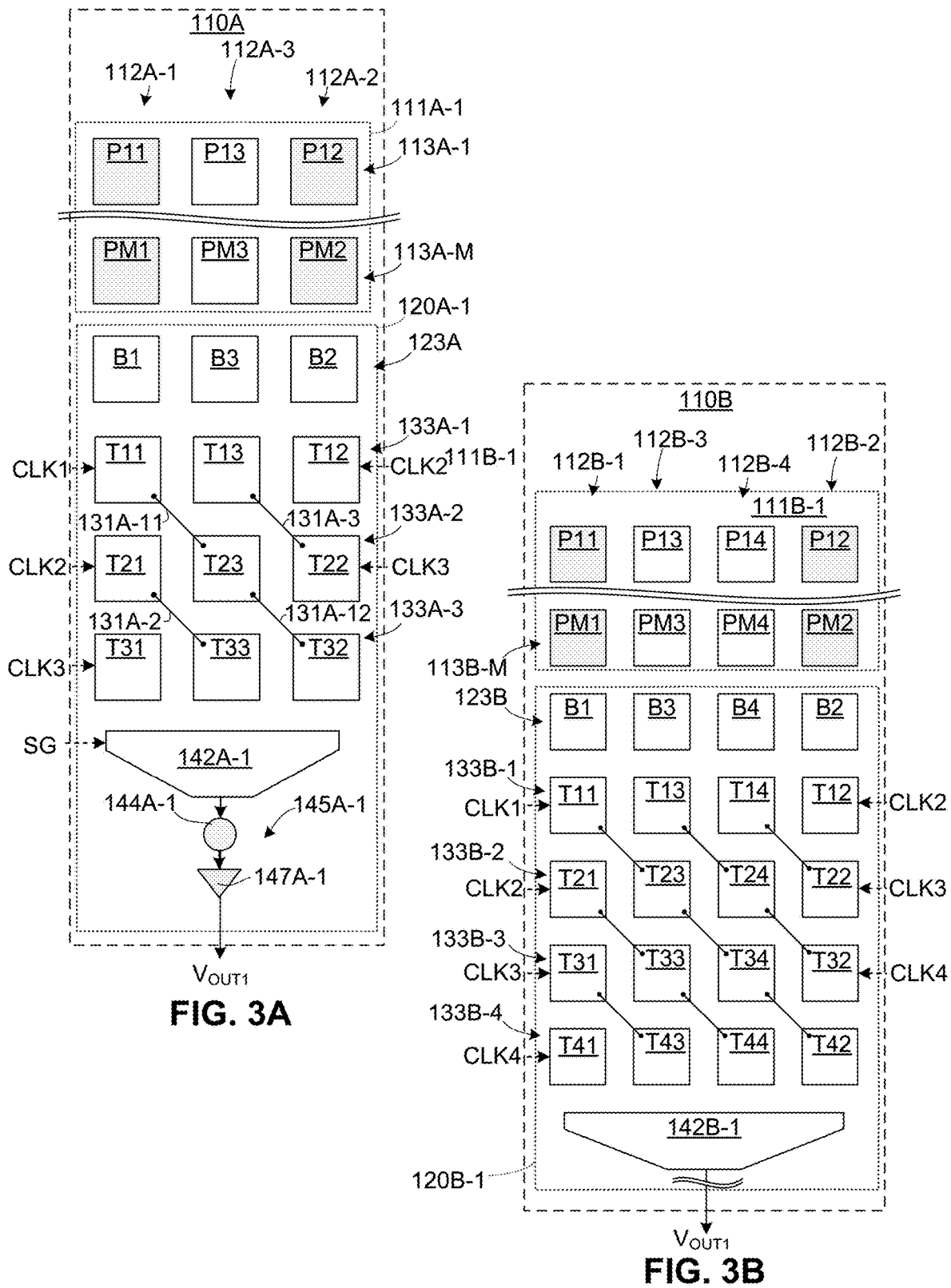
FIGS. 3A and 3B respectively depict a simplified three-column-per-channel CCD sensor and a simplified four-column-per-channel CCD sensor according to alternative exemplary embodiments of the present invention.

FIGS. 3A and 3B respectively depict a simplified three-column-per-channel CCD sensor 110A and a simplified four-column-per-channel CCD sensor 110B according to alternative exemplary embodiments of the present invention, where each of sensors 110A and 110B may be implemented in place of generalized sensor 110 of FIG. 1. Specifically, CCD sensor 110A (FIG. 3A) includes a group 111A-1 having pixels P11 to PM3 arranged three columns 112A-1, 112A-2 and 112A-3 and M pixel rows 113A-1 to 113A-M that transfer image charges to a readout circuit structure 120A-1, and CCD sensor 110B includes a group 111B-1 having pixels P11 to PM4 arranged four columns 112B-1 to 112B-4 and M pixel rows 113B-1 to 113B-M that transfer image charges to a readout circuit structure 120B-1. In each sensor 110A and 110B, image charges are generated and transferred down the columns of pixels in response to three-phase pixel control (line clock) signals PV1, PV2 and PV3 as described above with reference to FIG. 1. Each sensor 110A and 110B includes multiple channels like those shown in FIGS. 3A and 3B.

Each readout structures 120A-1 (FIG. 3A) and 120B-1 (FIG. 3B) includes a row of N buffer cells, N×N transfer gates disposed in N rows and N columns, a shared summing gate and an output circuit, where "N" represents the number of pixel columns disposed in pixel group 111A-1 and 111B-1 (i.e., N equals three in the case of sensor 110A, and N equals four in the case of sensor 110B). For example, pixel group 111A-1 of sensor 110A includes three columns 112A-1, 112A-2 and 112A-3, so readout structure 120A-1 includes a row 123A including three buffer cells B1, B2 and B3, nine transfer gates T11 to T33 disposed in three rows 133A-1, 133A-2 and 133A-3, shared summing gate 142A-1 and output circuit 145A-1. Similarly, pixel group 111B-1 of sensor 110B includes four columns 112B-1, 112B-2, 112B-3 and 112B-4, so readout structure 120B-1 includes a row 123B including four buffer cells B1, B2, B3 and B4, sixteen transfer gates T11 to T44 disposed in four rows 133B-1, 133B-2, 133B-3 and 133A-4, shared summing gate 142B-1 and output circuit 145B-1. In each case the buffer cells and transfer gates are configured to transfer respective image signals from multiple (N) columns to the (single) shared summing gate in accordance with N transfer gate control signals (i.e., three signals CLK1, CLK2 and CLK3 in the case of readout circuit 120A-1, and four signals CLK-1, CLK2, CLK3 and CLK4 in the case of readout circuit 120B-1), which in turn passes the image signals to an associated output circuit 145A-1 or 145B-1 in accordance with a summing gate control signal SG. According to an aspect of the present invention, the N×N transfer gates of output circuits 120A-1 and 120B-1 are configured and coupled such that each of the N transfer gates in each transfer gate row of output circuits 120A-1 and 120B-1 is controlled by a different transfer gate control signal, and each of the N transfer gates in each of the N columns of output circuits 120A-1 and 120B-1 is controlled by a different transfer gate control signal. For example, in output circuit 120A-1 (FIG. 3A), transfer gate T11 is controlled by signal CLK1, transfer gate T12 is controlled by signal CLK2, and transfer gate T13 is controlled by signal CLK3, whereby the three transfer gates in transfer gate row 133A-1 are controlled by different transfer gate control signals. Similarly, referring to column 112A-1 of output circuit 120A-1 (FIG. 3A), transfer gate T11 is controlled by signal CLK1, transfer gate T21 is controlled by signal CLK2, and transfer gate T31 is controlled by signal CLK3, whereby the three transfer gates in column 112A-1 are controlled by different transfer gate control signals. This feature similarly applies to rows 133A-2 and 133A-3 and columns 112A-2 and 112A-3 of output circuit 120A-1, and to rows 133B-1 to 133B-4 and 112B-1 to 112B-4 of output circuit 120B-1. In one embodiment, this feature is achieved by way of applying each transfer gate control signal to a transfer gate in one row and passing the transfer gate control signal to one or more associated transfer gates in one or more other rows by way of conductive link(s). For example, in FIG. 3A transfer gate T11 passes signal CLK1 to associated transfer gate T23 in transfer gate row 133A-2 by way of a conductive link 131A-11, which in turn passes signal CLK1 to associated transfer gate T32 in transfer gate row 133A-3 by way of a conductive link 131A-12. In a similar manner, transfer gate T21 passes signal CLK2 to associated transfer gate T33 by way of a conductive link 131A-2, and transfer gate T22 passes signal CLK3 to associated transfer gate T13 by way of a conductive link 131A-3.

Figure 4F:
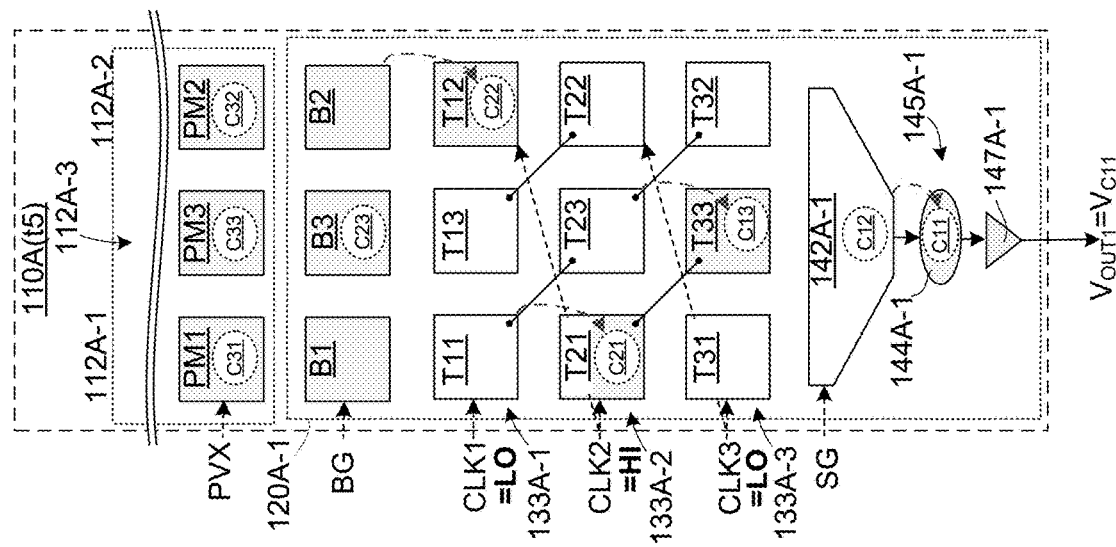

FIGS. 4A to 4H depict a portion of three-column-per-channel CCD sensor 110A (FIG. 3A) during the transfer of image charges from pixel group 111A-1 to readout structure 120A-1 during exemplary simplified operation of sensor 110A. In these figures the operating state of sensor 110A is depicted at sequential time periods t0 to t7, which are indicated in parentheses at the top of each figure (e.g., FIG. 4A shows sensor 110A during an initial time period t0, indicated by "110A(t0)"). To simplify the following description, only the position of image charges starting with charges C11, C12 and C13 is depicted in FIGS. 4A to 4H, and other image charges concurrently being processed by readout circuit structure 120A-1 during and prior to time t0 are omitted for clarity.

FIG. 4A shows sensor 110A(t0) when image charges C11, C12 and C13 are simultaneously transferred in parallel from edge pixel row 113A-M to buffer row 123A in accordance with assertion of buffer control signal BG, and charges C21, C22 and C23 are simultaneously transferred from a prior pixel row (not shown) into edge row 113A-M in accordance with control signals PVX (e.g., signals PV1, PV2 and PV3). At this point image charges C21, C22 and C23 are respectively stored in pixels PM1, PM2 and PM3 and continue to receive image data from a sample, as described above, prior to being passed into readout structure 120A-1.

Figure 4E:
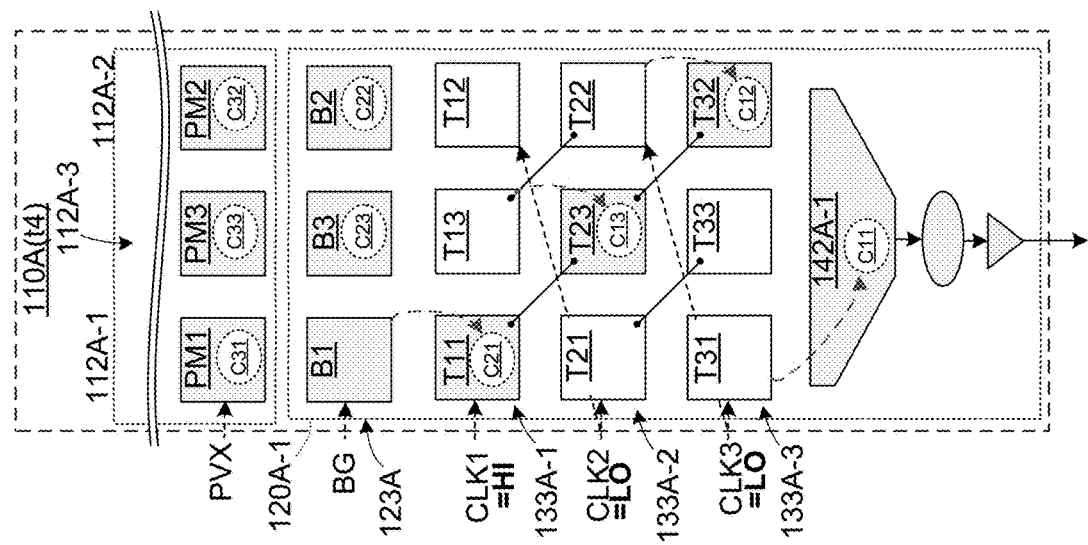
Figure 4D:
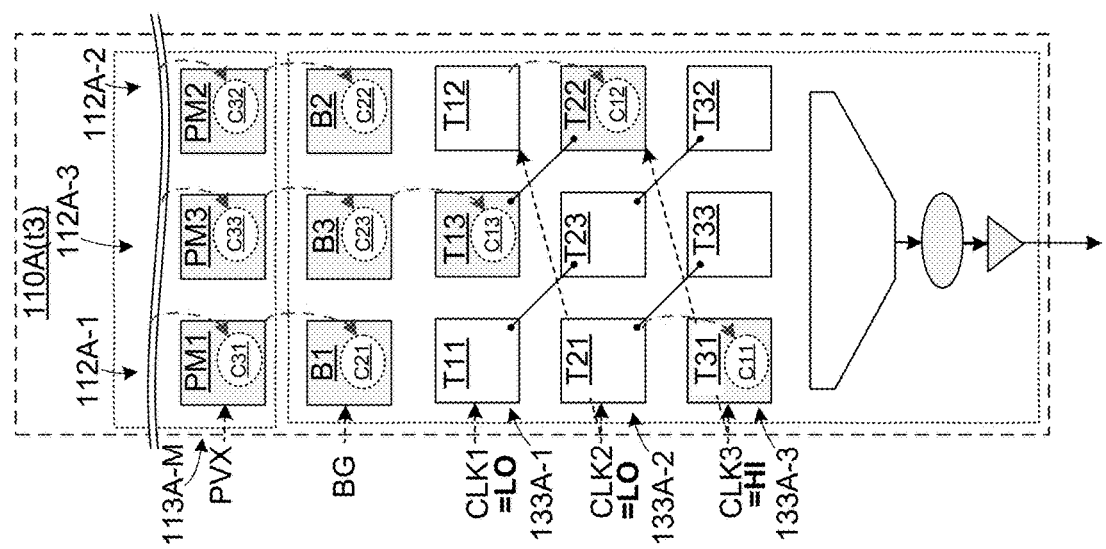

FIGS. 4B, 4C and 4D depict sensor 110A at time periods t1, t2 and t3 during the alternating (sequential) transfer of image charges C11, C12 and C13 into first transfer gate row 133A-1 from buffer cells B1 to B3 according to a simplified exemplary embodiment. During time period t1 (FIG. 4B), transfer gate control signal CLK1 is actuated/toggled (signals CLK2 and CLK3 are de-activated) to cause the transfer of image charge C11 from buffer cell B1 in (first) column 112A-1 into (first) transfer gate T11. During time period t2 (FIG. 4C), transfer gate control signal CLK2 is actuated (and signals CLK1 and CLK3 are de-activated) to cause the transfer of image charge C12 from buffer cell B2 in (second) column 112A-2 into transfer gate T12, and to cause the transfer of image charge C11 from first transfer gate T11 into transfer gate T21. During time period t3 (FIG. 4D), transfer gate control signal CLK3 is actuated (signals CLK1 and CLK2 are de-activated) to cause the transfer of image charge C13 from buffer cell B3 in middle (third) column 112A-3 into transfer gate T13, to cause the transfer of image charge C11 from transfer gate T11 into transfer gate T31, and to cause the transfer of image charge C12 from transfer gate T12 into transfer gate T22. As indicated in FIG. 4D, subsequent to the transfer of image charge C13, image charges C21, C22 and C23 are simultaneously transferred in parallel from edge pixel row 113A-M to buffer row 123A in accordance with assertion of buffer control signal BG, and charges C31, C32 and C33 are simultaneously transferred from a prior pixel row (not shown) into edge row 113A-M in accordance with control signals PVX.

FIGS. 4E, 4F and 4G depict sensor 110A during time periods t4, t5 and t6 during the subsequent sequential transfer of image charges C21, C22 and C23 from buffer row 123A into output circuit 120A-1 while image charges C11, C12 and C13 are sequentially transferred into summing gate 142-1.

FIG. 4E depicts image sensor 110 during (first) time period t4 after the second row of image charges are into output circuit 120A-1, when (first) transfer clock signal CLK1 is again asserted (i.e., CLK1=HI) to transfer a (first) image charge C21 of the second row into (first) transfer gate T11, and also to transfer (fourth) image charge C11 of the first row of image charges into summing gate 142A-1. As indicated by the dashed-line arrows, transfer gates T11-133 are configured and coupled such that the assertion of signal CLK1 during time period t4 causes image charge C21 to be transferred from (first) buffer cell B1 to (first) transfer gate T11, causes image charge C12 to be transferred from (second) transfer gate T22 to (third) transfer gate T32, and causes image charge C13 to be transferred from (fourth) transfer gate T13 to (fifth) transfer gate T23. Note that the assertion of signal CLK1 causes the transfer of one optical charge in each of the three columns 112A-1 to 112A-3 (i.e., buffer cell B1 and transfer gate T11 are in column 112A-1, transfer gates T22 and T32 are in second column 112A-2, and transfer gates T13 and T23 are in third column 112A-3). Also note that the assertion of signal CLK1 causes the transfer of optical charges such that only one optical charge is disposed in each of the three transfer gate rows 133A-1 to 133A-3 during a given time period (i.e., charges C21, C12 and C13 are respectively disposed in transfer gates T11, T32 and T23 during time t4, where transfer gate T11 is disposed in first transfer gate row 133A-1, transfer gate T23 is disposed in second transfer gate row 133A-2, and transfer gate T32 is disposed in third transfer gate row 133A-3). With this arrangement, one image charge (i.e., image charge C11 in FIG. 4E) is transferred from (sixth) transfer gate T31 into shared summing gate 142A-1 during (first) time period t4.

FIG. 4F depicts image sensor 110 during (second) time period t5 when (second) transfer clock signal CLK2 is asserted (i.e., CLK2=HI) to transfer a (second) image charge C22 of the second row of image charges into (seventh) transfer gate T12, and also to transfer (fifth) image charge C12 of the first row of image charges into summing gate 142A-1. As indicated by the dashed-line arrows, assertion of signal CLK2 during time period t5 causes image charge C22 to be transferred from (second) buffer cell B2 to (seventh) transfer gate T12, causes image charge C21 to be transferred from (first) transfer gate T11 to (eight) transfer gate T21, and causes image charge C13 to be transferred from (fifth) transfer gate T23 to (ninth) transfer gate T33. As indicated in FIG. 4F, during (first) time period t4, summing gate 142A-1 is controlled by way of summing gate control signal SG to transfer (fourth) image charge C11 to floating diffusion 144A-1 of output circuit 145A-1, whereby the associated charge stored on floating diffusion 144A-1 causes amplifier 147A-1 to generate an output voltage signal $V_{OUT1}$ that is equal to a voltage $V_{C11}$ corresponding to a charge amount of image charge C11. In addition (second) image charge C12 is transferred from (third) transfer gate T32 to summing gate 142A-1 during time period t5.

During subsequent time period t6 (FIG. 4G), (third) transfer clock signal CLK3 is asserted (i.e., CLK3=HI) to transfer a (third) image charge C23 of the second row of image charges into (fourth) transfer gate T13, and also to transfer (sixth) image charge C13 of the first row of image charges into summing gate 142A-1. As indicated by the dashed-line arrows, assertion of signal CLK3 during time period t6 causes image charge C23 to be transferred from (third) buffer cell B3 to (fourth) transfer gate T13, causes image charge C22 to be transferred from (seventh) transfer gate T12 to (second) transfer gate T22, and causes image charge C21 to be transferred from (eighth) transfer gate T21 to (sixth) transfer gate T31. In addition, summing gate 142A-1 is controlled by summing gate control signal SG (e.g., transmitted from output control circuit 177, see FIG. 1) to transfer image charge C12 into floating gate 144A-1, whereby the associated charge stored on floating diffusion 144A-1 causes amplifier 147A-1 to generate an output voltage signal $V_{OUT1}$ equal to a voltage $V_{C12}$ corresponding to image charge C12. Note that floating diffusion 405-4 may be reset between each charge transfer (i.e. after transfer of C11 before transfer of C12). The reset transistor and the reset signal are not depicted in FIGS. 4A-4H in order to simplify the figures and explain the charge transfer operation more clearly. In addition, a buffer control circuit (e.g., circuit 173; see FIG. 1) asserts buffer control signal BG that control buffer cells B1, B2 and B3 to simultaneously respectively receive seventh, eighth and ninth image charges C31,C32, C33 (i.e., a third row of image charges) from edge pixel row 113A-M during (third) time period t6 after (sixth) image charge C23 is transferred from (third) buffer cell B3 to (fourth) transfer gate T13. Subsequently, a fourth row of image charges C41, C42 and C43 are transferred in to edge pixel row 113A-M in the manner described above.

FIG. 4H depicts sensor 110A during a subsequent time period t7 during which transfer clock signal CLK1 is again asserted to transfer the first image charge C31 of the third row of image charges from buffer cell B1 into transfer gate T11, to transfer image charge C23 from transfer gate T13 into transfer gate T23, to transfer image charge C22 from transfer gate T22 to transfer gate T32, and also to transfer (sixth) image charge C13 of the first row of image charges into summing gate 142A-1. In addition, summing gate 142A-1 is controlled to transfer image charge C13 into floating gate 144A-1, thereby causing amplifier 147A-1 to generate an output voltage signal $V_{OUT1}$ equal to a voltage $V_{C13}$ corresponding to image charge C13.

As established by the example shown in FIGS. 4A to 4H, sensor 100A provides a one-amplifier-per-three-columns (three-columns-per-channel) arrangement that facilitates the production of CCD sensor with small column pitches (e.g., between about 6 μm and about 25 μm) by way of avoiding the high switching currents, high read noise, and the amplifier space problems associated with one-amplifier-per-column approaches, while only marginally increasing output clock rates (i.e., summing gate control signal SG has a clock rate that is only three-times the line clock rate of line control signal(s) PVX).

Figure 5:
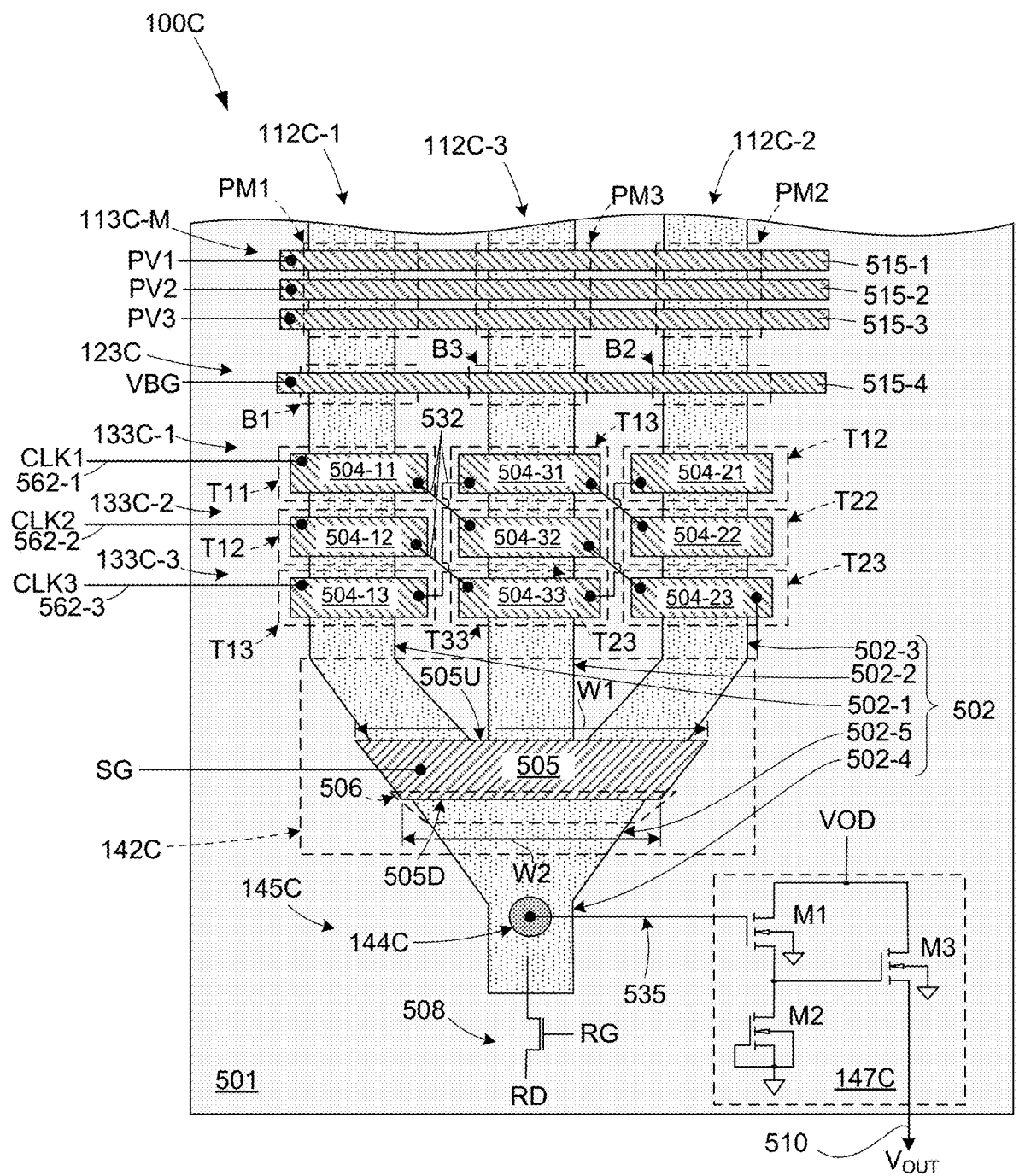
FIG. 5 illustrates a partial three-column-per-channel CCD sensor including a readout structure fabricated in accordance with another specific embodiment of the present invention.

FIG. 5 illustrates a partial multiple-column-per-channel CCD image sensor 100C according to an exemplary preferred embodiment of the present invention.

According to an aspect of the present invention, sensor 100C includes a symmetrical fork-shaped buried diffusion 502 that serves to facilitate the transfer of image charges from pixels disposed in three columns 112C-1, 112C-2 and 112C-2 to one shared output circuit. Fork-shaped buried diffusion 502 comprises a continuous n-doped region formed in a semiconductor substrate 501 and includes parallel upstream (first, second and third) elongated portions 502-1, 502-2 and 502-3 that are connected to a downstream (fourth) elongated portion 502-4 by way of a - shaped merge section 502-5. The continuous n-doped region is formed using known techniques such that image charges (comprising electrons) accumulated by the pixels in each column 112C-1 to 112C-3 are constrained to travel along upstream elongated portions 502-1 to 502-3, and are respectively directed by fork-shaped merge section 502-5 into downstream elongated portion 502-4.

Pixels are formed in respective associated columns 112C-1 to 112C-3 by way of polycrystalline silicon pixel gate structures 515-1, 515-2 and 515-3 respectively formed over upstream elongated portions 502-1, 502-2 and 502-3. Additional pixels may be formed in each column 511 and 512 (e.g., above edge pixel row 113C-M including pixels PM1, PM2 and PM3, which are shown in the figure). Image charges generated by pixels PM1, PM2 and PM3 are constrained to move down columns 112C-1 to 112C-3 by upstream elongated diffusion portions 502-1, 502-2 and 502-3, respectively, and by three-phase pixel control signals PV1, PV2 and PV3 that are generated in the manner described below.

Similar to the previous embodiment, sensor 100C includes three rows 113C-1, 113C-2 and 113C-2 having nine transfer gates T11 to T33, where first row 113C-1 includes transfer gates T11, T13 and T12, second row 113C-2 includes transfer gates T21, T23 and T22, and third row includes transfer gates T31, T33 and T32. First row transfer gates T11, T13 and T12 are formed by polycrystalline silicon transfer gate structures 504-11, 504-31 and 504-21 respectively operably disposed over upstream elongated diffusion portions 502-1, 502-2 and 502-3 between buffer cell row 123C and second row 133C-2 of transfer gates. Second transfer gate row 113C-2 is formed by polycrystalline silicon transfer gate structures 504-12, 504-32 and 504-22 respectively operably disposed over elongated diffusion portions 502-1, 502-2 and 502-3 between the first transfer gate row 113C-1 and third transfer gate row 133C-3. Third transfer gate row 113C-3 is formed by polycrystalline silicon transfer gate structures 504-13, 504-33 and 504-23 respectively operably disposed over elongated diffusion portions 502-1, 502-2 and 502-3 between the second transfer gate row 113C-2 and summing gate 142C, which is disposed over V-shaped merge section 502-4. With this arrangement, transfer gates T11, T12 and T13 are configured to transfer image charges passed along the leftmost (first) column 112C-1 toward V-shaped merge section 502-4, transfer gates T12, T22 and T32 are configured to transfer image charges passed along the rightmost (second) column 112C-2 toward V-shaped merge section 502-4, and transfer gates T13, T23 and T33 are configured to transfer image charges passed along the central (third) column 112C-3 toward summing gate 142C.

As set forth above, the transfer gate structures forming transfer gates T11 to T13 are effectively coupled to facilitate efficient and reliable transfer of image charges from columns 112C-1, 112C-2 and 112C-3 to summing gate 142C. Specifically, (first) transfer gate T11, (third) transfer gate T32 and (fifth) transfer gate T23 are coupled to simultaneously receive transfer gate control signal CLK1, which is transmitted on signal line 562-1, (eighth) transfer gate T21, (ninth) transfer gate T33 and (seventh) transfer gate T12 are coupled to receive transfer gate control signal CLK2, which is transmitted on signal line 562-2, and (sixth) transfer gate T31, (fourth) transfer gate T13 and (second) transfer gate T22 are coupled to receive transfer gate control signal CLK3, which is transmitted on signal line 562-3. This arrangement is referred to herein as effective coupling because associated transfer gates (e.g., T11, T23 and T32) are effectively coupled such that, for example, when (first) transfer gate control signal CLK1 is applied on first transfer gate structure T11, it is substantially simultaneously applied to (third) transfer gate T32 and (fifth) transfer gate structure T23.

According to the depicted embodiment, the effective coupling of associated transfer gates is at least partially achieved using one or more conductive (e.g., metal or doped polycrystalline silicon) linking structures that are connected between the associated transfer gate structures. Referring to the region between columns 112C-1 and 112C-2 in FIG. 5, first-row, first column transfer gate T11 is implemented by horizontally oriented elongated polycrystalline silicon gate structure 504-11, and is connected to second-row, middle column transfer gate structure 504-32 by way of an associated conductive linking structure 532. Similarly, transfer gate T23 is coupled to transfer gate T32 by a second conductive link structure extending between gate structures 504-32 and 504-23. This linking arrangement facilitates reliable cross-couple control over associated transfer gate structures 504-11, 504-32 and 504-23 in that, when transfer gate control signal CLK1 is applied to transfer gate structure 504-11, it is also substantially simultaneously applied to transfer gate structures 504-32 and 504-23 (i.e., by way of transmission over intervening conductive linking structures 532).

A summing gate 142C is formed over V-shaped merge region 502-4 such that summing gate 142C functions to transfer image charges from columns 112C-1, 112C-2 or 112C-3 512 to downstream elongated diffusion portion 502-4. In one embodiment, summing gate 142C is implemented as a tapered polycrystalline silicon structure 505 having an upstream edge 505U having a width W1 (i.e., measured in a direction perpendicular to columns 112C-1 to 112C-3) that is longer than a width W2 of its downstream edge 505D. This tapered summing gate structure facilitates efficient transfer of image charges from upstream elongated diffusion portions 502-1 to 502-3 to downstream elongated diffusion portion 502-4. Summing gate 142C is controlled by applying summing gate control signal SG to structure 505, whereby summing gate 142C functions in a manner similar to that described above with reference to summing gate 142A, where a clock rate of summing gate control signal SG is three times faster than a line clock rate of the pixel control signals PV1, PV2 and PV3. In one embodiment, an additional tapered output gate structure 506 is disposed over a downstream portion of the V-shaped merge section 502-5 (i.e., between summing gate structure 505 and downstream elongated diffusion portion 502-4), and functions to prevent charge spill from the sense node back to summing gate 142C.

During operation, image charges are generated in pixels 520-1 and 520-2 are transferred along columns 511 and 512 at a clock rate determined by line clock signals PV1, PV2 and PV3. Examples of waveforms of the various control signals are shown in FIG. 8. A simplified explanation follows of how waveforms such as those shown in FIG. 8 can transfer charges in sensor 500. Note that FIG. 8 includes the control signal VBG for a buffer cell which is present in some embodiments, but not depicted in FIG. 5. When transfer gate control signal C1 generates a high voltage (i.e. a voltage that is more positive than a low voltage) on signal line 562-1, potential wells are formed under transfer gate structures 504-11 and 504-22. Similarly, when transfer gate control signal C2 generates a high voltage on signal line 562-2, potential wells are formed under transfer gate structures 504-12 and 504-21. When line clock signal PV3 is driven to a low voltage, image charges transfer from under pixels 520-1 and 520-2 (or, alternatively, when the control signal VB on the buffer cell in, for example, FIGS. 5G and 8A is driven to a low voltage, image charges transfer from under intervening buffer cells in columns 511 and 512, not shown) to under transfer gate structures 504-11 and 504-12. Implanted barriers at appropriate locations in channels 502-1 and 502-2 prevent the charges from transferring under gates 504-21 and 504-22 while control signals C1 and C2 are at approximately equal potentials. The use of implanted barriers to enable two-phase clocking in CCDs is well known. Next, transfer gate control signal C1 toggles such that the voltage on signal line 562-1 switches from high to low, while transfer gate control signal C2 is still high, whereby potential wells under transfer gates 504-11 and 504-22 collapse. Thus, the image charge under transfer gate 504-11 moves under transfer gate 504-21, and an image charge under transfer gate 504-22 moves under summing gate 505. When transfer gate control signal C2 switches from high to low, the image charge under transfer gate 504-21 moves under summing gate structure 505 while the image charge under transfer gate 504-12 moves under transfer gate 504-22. By way of example but not as a limitation, a high voltage may mean a voltage of approximately +5V, whereas a low voltage may mean a voltage of approximately −5V, relative to the potential of the substrate. One skilled in the relevant art understands that the appropriate voltages to use depend on many factors including doping level(s) in the buried channel, doping levels of the polysilicon gate electrodes, thicknesses and dielectric constants of dielectric layers, and dimensions and full-well capacity of the pixels and gate structures.

By repeating the operations described above, image charges generated by pixels in two columns (i.e., columns 511 and 512) are sequentially transferred to a single output circuit by way of shared (common) summing gate 505. Simultaneously, other pairs of columns sequentially clock their charges under the corresponding common summing gates provided for those pairs of columns. Exemplary voltage waveforms and timing configurations of the above clock signals are depicted in additional detail in FIGS. 8A, 8B, and 8C. In the preferred embodiment shown in FIG. 5, each column utilizes one transfer gate pair to clock image charge to the common summing gate. In other embodiments, two or more transfer gate pairs per column could be used to implement other charge transfer schemes. Note that sensor 500 may also be operated to sum charges from the two columns in summing gate 505 by reading out summing gate 505 at the same rate as the line clock instead of at twice the line clock frequency. This allows an instrument incorporating sensor 500 to have different operating modes that trade off spatial resolution for improved signal-to-noise ratio.

Referring to the lower portion of FIG. 5, output circuit 145C is implemented by a floating diffusion 144C formed in downstream elongated diffusion portion 502-4, and an on-chip pre-amplifier circuit 147C that is operably coupled to floating diffusion 144C by way of a suitable (metal or polysilicon) conductive structure 535. On-chip pre-amplifier 147C functions to convert image charges stored on floating diffusion 144C to voltage signals, and to deliver buffered voltage signals $V_{OUT}$ to output terminal 510. A pre-amplifier is widely used in CCD sensors to amplify and/or buffer the signal and prepare it for further processing. Multiple pre-amplifier and buffer configurations known in the art are suitable for use in multiple-column-per-channel CCD image sensor 100C. Pre-amplifier 147C may comprise multiple transistors, resistors, and capacitors. By way of example, amplifier 147C may comprise two stages of source followers. The first stage source follower includes a gain transistor M1 and a current sink transistor M2; the second stage source follower includes a gain transistor M3, whereby output terminal 510 of amplifier 147C is formed by the source terminal of transistor M3. A reset transistor 508 is provided that includes a source terminal connected to floating diffusion 144C, a gate terminal controlled by a reset clock signal RG, and a drain terminal connected to a reset voltage RD. A typical operation (integration and readout) cycle begins by resetting floating diffusion 144C to voltage RD by way of toggling reset transistor 508, waiting a predetermined integration period, then sampling output voltage at output terminal 510. During the integration period, the voltage level at output terminal 510 changes (becomes more negative) by an amount proportional to the image charge funneled to floating diffusion 144C. During the readout period, an ADC (not shown) measures the analog voltage level and converts it to a digital number for further signal processing. The ADC may be located on chip or off chip.

Sensor 110C is fabricated using techniques similar to those shown and described in related U.S. Published Patent Application No. 2017-0295334-A1, which is incorporated herein by reference in its entirety.

Figure 6:
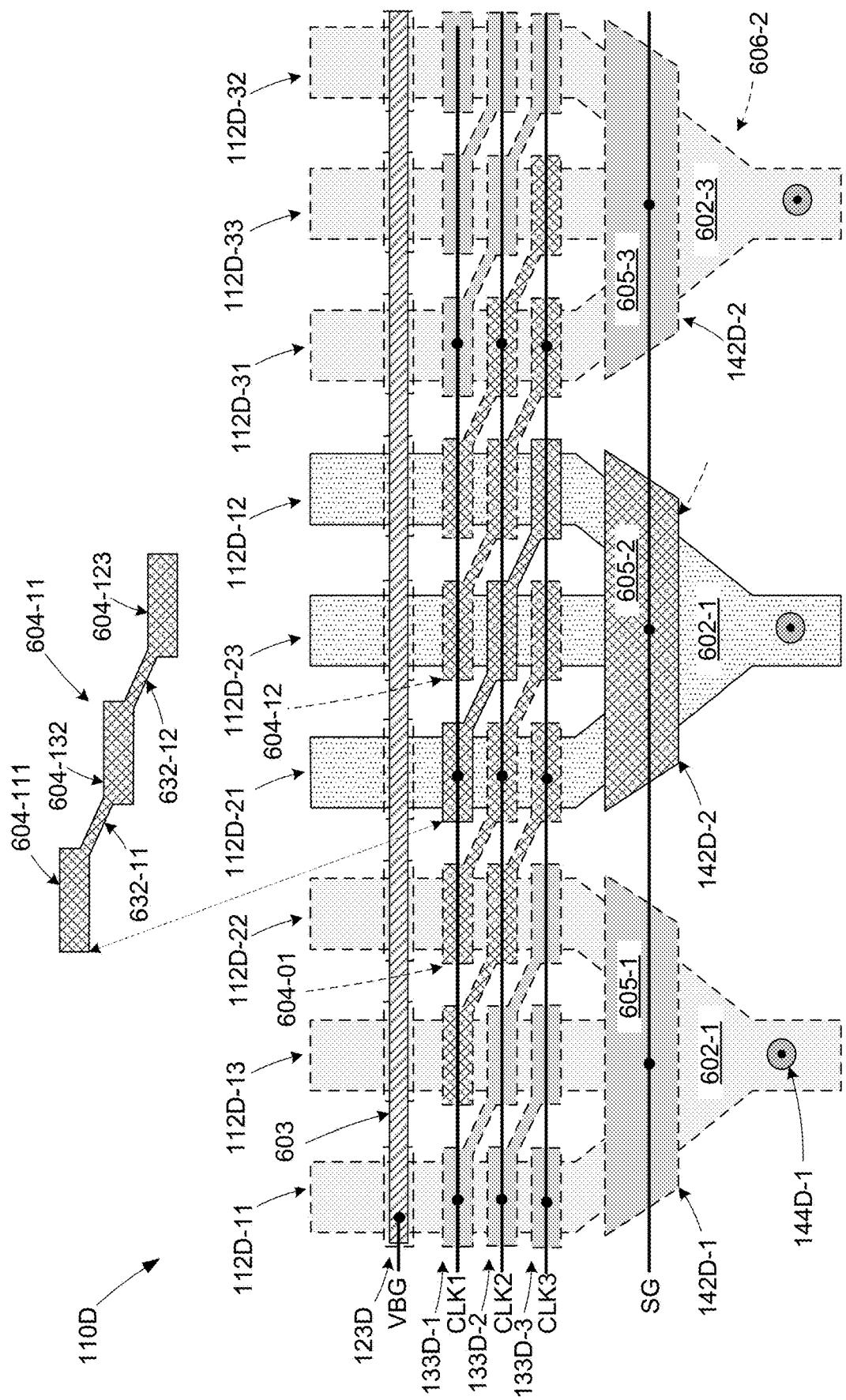
FIG. 6 is a simplified plan view showing a partial three-column-per-channel CCD sensor in accordance with another specific embodiment of the present invention.

FIG. 6 illustrates a partial multi-column-per-channel CCD image sensor 110D according to another exemplary preferred embodiment of the present invention. Similar to sensor 110C (described above), sensor 110D utilizes fork-shaped buried diffusions 602-1, 602-2 and 602-3 to facilitate the transfer of image charges from pixels (not shown) disposed in associated columns 112D-11 to 112D-33, where each associated group of columns share a single sense node 144D formed in the manner described above (e.g., columns 112D-11, 112D-12 and 112D-13 share sense node 144D-1). Similar to the previous embodiment, sensor 110D includes a row 123D of buffer cells controlled by a polycrystalline silicon buffer cell structure 603, three rows 133D-1, 133D-2 and 133D-3 of transfer gates formed by polycrystalline silicon transfer gate structures (described below), tapered polycrystalline silicon summing gate structures 605-1 to 605-3. Image sensor 110D operates substantially as described above with reference to sensor 110C.

Sensor 110D differs from sensor 110C in that the three rows of transfer gates utilized by sensor 110D are implemented using integral step-shaped composite polycrystalline silicon structures. As indicated in upper portion of FIG. 6, one such step-shaped composite polycrystalline silicon structure 604-11 includes a first (upper) horizontal step portion that forms first-row (first) transfer gate structure 604-111, a second (middle) horizontal portion that forms second row (fifth) transfer gate structure 604-132, a third (lower) horizontal portion that forms third row (third) transistor gate structure 604-123, a diagonal (first) polycrystalline silicon conductive linking structure 632-11 that integrally connects transfer gate structures 604-111 and 604-132, and a second diagonal polycrystalline silicon conductive linking structure 632-12 that integrally connects transfer gate structures 604-123 and 604-132. Additional step-shaped composite polycrystalline silicon structures are indicated in dashed lines in order to more clearly depict the features of transfer gate structure 604-11, but are understood to be essentially identical in structure. Similar to sensor 110C, the step-shaped composite polycrystalline silicon structures provide effective coupling between associated first-, second- and third-row transfer gates by way of applying transfer control signals CLK1, CLK2 and CLK3 to step-shaped composite polycrystalline silicon structures in an alternating pattern. Specifically, associated transfer gate structures 604-111, 604-132 and 604-123 are coupled by polycrystalline silicon conductive linking structures 632-11 and 632-12 such that a first control signal CLK1 applied to transfer gate structure 604-111 is transmitted by way of conductive linking structure 632-11 to transfer gate structure 604-132, and from transfer gate structure 605-132 to transfer gate structure 604-123 by way of conductive linking structure 632-12. Polycrystalline silicon structures 604-01 and 604-12 are disposed on opposite sides of polycrystalline silicon structure 604-11, and therefore are connected to receive control signals CLK2 and CLK3, respectively, thereby establishing an effective coupling between associated transfer gate structures.

Figure 7:
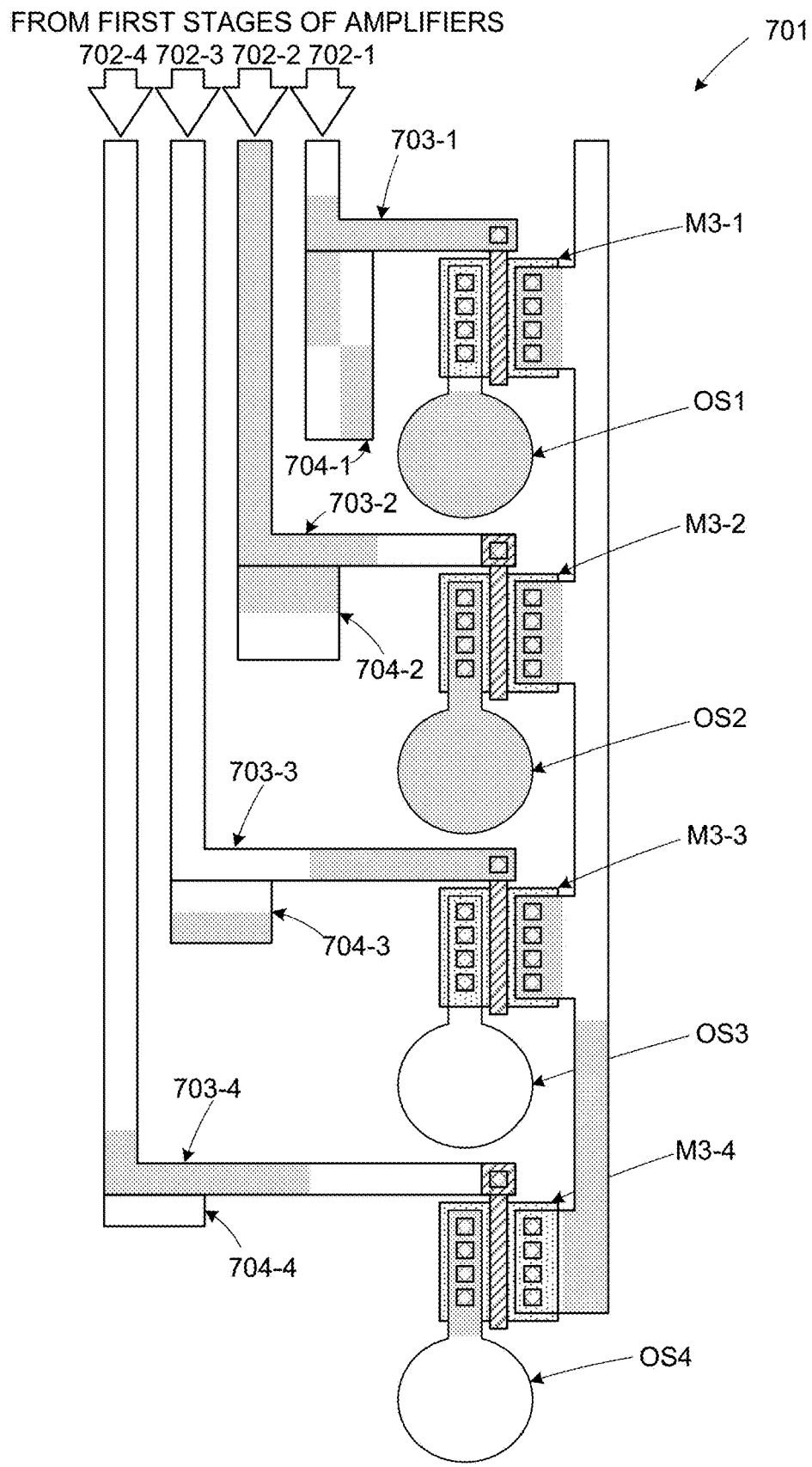
FIG. 7 is a simplified plan view depicting operation of the three-column-per-channel CCD sensor of FIG. 6 in accordance with an embodiment of the present invention.

FIG. 7 illustrates an exemplary layout for metal interconnects of an on-chip amplifier in which sensor outputs are optimized with equalized response and minimized crosstalk. Although various types of amplifiers could be used in CCD image sensors to convert image charge to voltage and drive external load at the output circuit of each channel, for illustrative purposes an amplifier comprising two stages of source followers is shown. In a preferred embodiment, one block of sensor outputs 701 comprises four channels of two-stage source follower amplifiers, whereby the first stage 702 is not shown in FIG. 7 for brevity (first stage 702 is located close to the floating diffusion as described above). Metal interconnects 703-1, 703-2, 703-3, and 703-4 connect the output terminals of the first stages 702-1, 702-2, 702-3, and 702-4 to the corresponding gate terminals of second stage transistors M3-1, M3-2, M3-3, and M3-4, respectively. The source terminals of the second stage transistors are connected to metal pads OS, namely, M3-1 to OS1, M3-2 to OS2, M3-3 to OS3, and M3-4 to OS4. In one embodiment, the CCD image sensor is flip-chip bonded to a second semiconductor (e.g., silicon) substrate with one or more ADCs and other signal processing circuits. An ADC reads a sensor output signal at a metal pad through a solder ball.

For each two-stage amplifier, the first stage transistors are kept small to minimize the load on the floating diffusion. This results in a low transconductance and low driving capability of first stage 702. For that reason, the second stage comprises a larger transistor M3 to drive an external circuit which may have an input capacitance as large as several pico-farads. As most heat dissipation happens in the second stage, it is important to spread out the large transistors M3-1, M3-2, M3-3, and M3-4. Furthermore, in a preferred embodiment, metal pads OS1, OS2, OS3, and OS4 with a diameter of about 50 µm to 100 µm are used to provide good mechanical strength for flip-chip bonding. As the lateral width of a typical CCD pixel in a preferred embodiment is between about 6 µm and about 25 µm, four channels of sensor outputs can be grouped in block 701 in order to accommodate large transistors and metal pads. Depending on the pixel size, the output transistor size and the metal pad size, fewer or more channels could be grouped in one block of sensor outputs. However, the number of channels in one block should be as few as practical in order to keep the metal interconnects short enough for high bandwidth operation, while maintaining a high transistor and metal pad density. In preferred embodiments, the number of output channels in one block is between two and eight.

In one embodiment, transistors M3-1, M3-2, M3-3, and M3-4 are placed close to metal pads OS1, OS2, OS3, and OS4, respectively. Metal interconnects 703-1, 703-2, 703-3, and 703-4 between the first and second stages of the amplifiers have different lengths to spread out transistors M3-1, M3-2, M3-3, and M3-4 within the block. For the channel driving the metal pad OS1, which is closest to the first stage of the amplifier, metal interconnect 703-1 is the shortest and would add a minimal load to the first stage 702-1 in the absence of metal piece 704-1. For the channel driving the farthest metal pad OS4, metal interconnect 703-4 is the longest, and its capacitance becomes the dominant contributor to the total load on the first stage 702-4. Metal pieces 704-1, 704-2, 704-3, and 704-4 with successively smaller areas are added to metal interconnects 703-1, 703-2, 703-3, and 703-4 respectively to balance interconnect capacitances between different channels. With equalized total load capacitance across all the four channels, the sensor outputs feature uniform channel response and minimized crosstalk. Note that, in one embodiment, 704-4 may be omitted since the associated interconnect 703-4 has the largest capacitance. Note also that, although the areas of the traces 703-1, 703-2 etc. are usually the biggest factors determining the bandwidths of the outputs, other factors including the doping of the silicon beneath traces 703-1, 703-2 etc., the resistance of any polysilicon interconnects, and the transconductances of transistors such as M3 shown in FIG. 5 may result in different outputs having different bandwidths in absence of metal pieces 704-1, 704-2 etc. The areas of metal pieces 704-1, 704-2 etc. may be chosen so as to compensate for these and other factors. In an alternative embodiment, the second stage transistors may be placed close to the first stage transistors with different length traces connecting those transistors to the metal pads such as OS1, OS2, OS3 and OS4.

FIG. 8 illustrates exemplary voltage waveforms and timing configurations of clock signals to drive the on-chip multiple-column-per-channel readout structure in accordance with one embodiment of the present invention. Voltage and time are plotted in arbitrary units. Voltages of different clock signals are not necessarily plotted to the same scale.

Although a three-phase CCD array sensor is utilized in the particular embodiment illustrated in FIG. 8, the present clock driving scheme can also apply to other CCD area sensors and line sensors. Each pixel of the three-phase CCD sensor comprises three polysilicon gates driven by continuous phase clocks P1V, P2V, and P3V, respectively. The phase clocks are synchronized to a line clock (not shown), which controls charge transfer from a row of pixels to the readout structure. Each of the three clock signals is shifted in phase by 120 degrees relative to the other two clock signals, enabling charge transfer down the column as briefly described in FIG. 4. U.S. Pat. No. 7,609,309, entitled "Continuous clocking of TDI sensors", issued on Oct. 27, 2009 and U.S. Pat. No. 7,952,633, entitled "Apparatus for continuous clocking of TDI sensors", issued on May 31, 2011 describe additional aspects and details of the continuous clock driving scheme. Both patents are incorporated herein by reference.

Referring to the multiple-column-per-channel readout structure depicted in FIG. 5 and its clock driving scheme illustrated in FIG. 8, clock signal VBG drives the row of buffer cells 123C, clock signals C1, C2 and C3 refer to transfer clock signals CLK1, CLK2 and CLK3, respectively, which drive the three rows of transfer gates T11 to T33, clock signal SG drives the summing gate, clock signal RG drives the gate of reset transistor 508, and $V_{OUT}$, which represents measured pixel values at the ADC. These control signals are synchronized to a free-running internal clock ADC-C of an ADC in an off-chip signal processing circuit. During a clock cycle, clock signal VBG increases gradually from low to high and drops sharply after it reaches a peak value. In a conventional CCD, image charges transfer from pixels to a horizontal output register (or to buffer cells similar to 503) at a constant rate because clock signals similar to P1V, P2V, P3V, and VB run at a constant frequency. In one embodiment that includes two rows of buffer cells, a second buffer cell clock signal (not shown), approximately 180° out of phase with VBG, drives that second row. In another embodiment with more than two rows of buffer cells, odd-numbered rows (starting with the row of buffer cells adjacent to the last row of pixels) are driven by clock signal VBG, and even-numbered rows are driven by a clock signal approximately 180° out of phase with VBG. An advantage of using an even number of rows of buffer cells is that the two buffer cell clock signals, being approximately 180° out of phase with one another, is that the currents from these clock signals approximately cancel minimizing noise currents flowing in the sensor. In one embodiment of the present invention clock signals C1, C2 and C3 sequentially move image charge from transfer gates T13, T23 and T33 (i.e., image charges respectively generated in the pixels of the three columns 112C-1, 112C-2 and 112C-3) into common summing gate 505, while clock signal SG transmits the image charge to floating diffusion 144C at twice the frequency of phase clocks P1V, P2V, and P3V. Clock signal RG resets the voltage of floating diffusion 144C in preparation for the image charge at the next clock cycle. Clock signal RST (not shown) is generated by a timing generator and is synchronized to ADC-C. After clock signal RG resets the voltage at the floating diffusion, clock signal SIG (not shown) triggers correlated double sampling (CDS) during which the sensor output is sampled and prepared for digitization.

In the illustrative example depicted in FIG. 8, transfer clock signals C1, C2 and C3 that drive the transfer gates are shown as rectangular pulses. In preferred embodiments, these clocks are shaped so as to reduce noise while ensuring efficient high-speed signal transfer. Rise and fall times of other clock signals are also controlled so as to ensure efficient charge transfer and to minimize noise. In one embodiment, clocks C1, C2 and C3 have approximately half sine-wave shapes similar to those illustrated for buffer clock VBG, but at twice the frequency. Since transfer clock signals C1, C2 and C3 are substantially 120° out of phase with each other, the currents that result from these clocks approximately cancel one another, reducing noise that might degrade the signal-to-noise ratio of the image.

FIG. 8 illustrates clock waveforms and timing for reading out each individual pixel of the image sensor as a separate signal. As long as the full-well capacity of the summing and output gates is large enough compared with the signal level, it is also possible to sum pairs of adjacent pixels by transferring the signal under each summing gate to the corresponding output gate and floating diffusion once per line clock rather than twice per line clock. Image rows may be summed together by, for example, transferring two lines into the buffer cells before transferring the signal under buffer cells to the first row of transfer gates. Systems and methods described in U.S. patent application Ser. No. 15/210,056 entitled "Dark-Field Inspection Using a Low-Noise Sensor", filed on Jul. 14, 2016 by Chuang et al., may be used in combination with the sensor described herein. This patent application is incorporated herein by reference.

Figure 9:
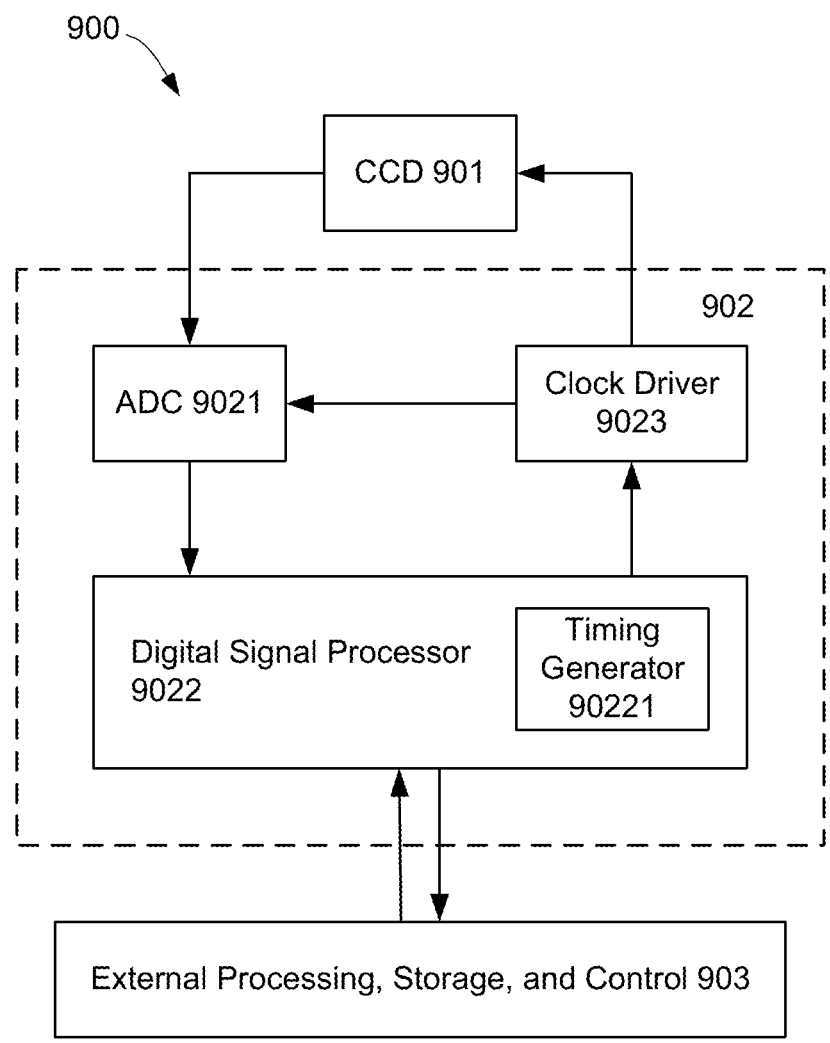
FIG. 9 illustrates an exemplary apparatus for driving a multiple-column-per-channel CCD image sensor and off-chip signal processing circuits with synchronization of the image sensor readout.

FIG. 9 is a simplified diagram of an apparatus 900 that can implement features and methodologies described herein. The apparatus includes a CCD image sensor 901 which comprises one of the multiple-column-per-channel CCD sensors disclosed herein, off-chip signal processing circuits 902, and external storage, processing, and control circuits 903. CCD sensor 901 detects incident radiation, converts photo-generated electrons to voltage, and outputs the voltage signal to off-chip signal processing circuits 902. For brevity only function blocks necessary to explain the present invention are depicted in the off-chip signal processing circuits 902. These include ADC 9021, digital signal processor 9022, and clock driver 9023. ADC 9021 comprises CDS and ADC circuits and digitizes the CCD analog output signals. A digital output of ADC 9021 is sent to digital signal processor 9022 for post-processing and, optionally, data compression. A timing generator 90221 incorporated in digital signal processor 9022 generates clock signals, which are buffered by clock driver 9023 to control CCD sensor 901 and ADC 9021. For example, clock driver 9023 may provide clock signals P1V, P2V, P3V, VB, C1, C2, SG, RG, OS, and ADC-C as described above and illustrated in FIG. 8. Digital signal processor 9022 interfaces with external storage, processing, and control circuits 903 for further signal processing, control and data transfer, such as clock synchronization.

Note that the apparatus depicted in FIG. 9 may incorporate the waveform generator described in U.S. Pat. No. 9,347,890, entitled "A Low-Noise Sensor and an Inspection System Using a Low-Noise Sensor", to Brown et al., and/or the apparatus may implement a method described in that application. The '890 patent is incorporated herein by reference.

Buffer cells, transfer gates, summing gates, output gates, readout gates, floating diffusion and output amplifiers are well known in CCD image sensors and will not be described in more detail here. The configurations shown in FIGS. 1, 3A, 3B, 5, 6, and 7 are merely by way of example to explain the operation of the multiple-column-per-channel CCD sensor. Different configurations of the readout structure are possible without departing from the scope of the invention. In one exemplary embodiment one or more transfer gate pairs with one or more buffer cells could be used. In another exemplary embodiment, five or more transfer gates may be connected to one summing gate. In this exemplary embodiment, each column would comprise five transfer gates, and five-phase clocks could be used to sequentially clock the signal from each column into the summing gate. These three-phase clocks would be substantially 72° out of phase with respect to one another. Such a sensor might be described as a five-column parallel CCD sensor, but it would operate in a substantially similar manner to the three-column parallel CCD sensors described herein and is within the scope of the present invention.

In another exemplary embodiment a self-aligned floating diffusion with a polysilicon contact connected to on-chip amplifier could be used. In yet another exemplary embodiment, metal interconnects of on-chip amplifier may be optimized to equalize channel response and minimize crosstalk. Details of commonly used semiconductor manufacturing processes that are not directly relevant to the invention are not included in order to avoid complicating the description.

Figure 10:
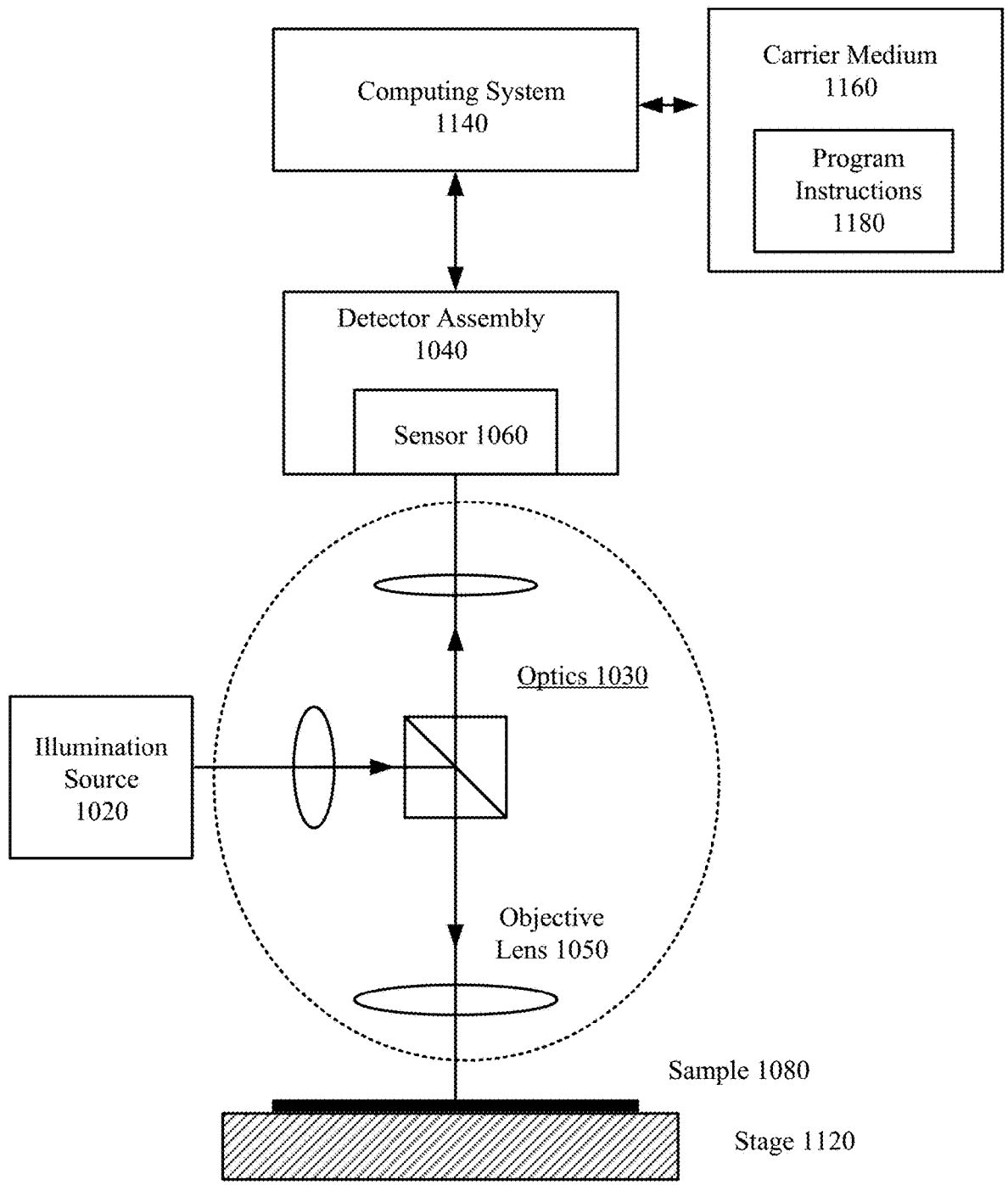
FIG. 10 illustrates an exemplary inspection system.

FIG. 10 illustrates an exemplary inspection system 1000 configured to inspect a sample 1080, such as a wafer, reticle, or photomask. Sample 1080 is placed on a stage 1120 to facilitate movement to different regions of sample 1080 underneath the optics. Stage 1120 may comprise an X-Y stage or an R-θ stage. In some embodiments, stage 1120 can adjust the height of sample 1080 during inspection to maintain focus. In other embodiments, an objective lens 1050 can be adjusted to maintain focus.

An illumination source 1020 may comprise one or more lasers and/or a broad-band light source. Illumination source 1020 may emit DUV and/or VUV radiation. Optics 1030, including an objective lens 1050, directs that radiation towards and focuses it on sample 1080. Optics 1030 may also comprise mirrors, lenses, polarizers and/or beam splitters (not shown for simplicity). Light reflected or scattered from sample 1080 is collected, directed, and focused by optics 1030 onto a sensor 1060, which is within a detector assembly 1040.

Detector assembly 1040 includes at least one of the sensors described herein. In one embodiment, the output of sensor 1060 is provided to a computing system 1140, which analyzes the output. Computing system 1140 is configured by program instructions 1180, which can be stored on a carrier medium 1160. In one embodiment computing system 1140 controls the inspection system 1000 and sensor 1060 to inspect a structure on sample 1080 and read out the sensor in accordance with a method disclosed herein.

In one embodiment, illumination source 1020 may be a continuous source, such as an arc lamp, a laser-pumped plasma light source, or a CW laser. In another embodiment, illumination source 1020 may be a pulsed source, such as a mode-locked laser, a Q-switched laser, or a plasma light source pumped by a Q-switched laser. In one embodiment of inspection system 1000 incorporating a Q-switched laser, the sensor or sensors within detector assembly 1040 are synchronized with the laser pulses.

One embodiment of inspection system 1000 illuminates a line on sample 1080, and collects scattered and/or reflected light in one or more dark-field and/or bright-field collection channels. In this embodiment, detector assembly 1040 may include a line sensor or an electron-bombarded line sensor. Another embodiment of inspection system 1000 illuminates an area on sample 1080, and collects scattered and/or reflected light in one or more dark-field and/or bright-field collection channels. In this embodiment, detector assembly 1040 may include an array sensor or an electron-bombarded array sensor.

Additional details of various embodiments of inspection system 1000 are described in U.S. Pat. No. 9,279,774, entitled "Wafer inspection system", issued on Mar. 8, 2016 to Romanovsky et al., U.S. Pat. No. 7,957,066, entitled "Split field inspection system using small catadioptric objectives", to Armstrong et al., U.S. Pat. No. 7,345,825, entitled "Beam delivery system for laser dark-field illumination in a catadioptric optical system", to Chuang et al., U.S. Pat. No. 5,999,310, entitled "Ultra-broadband UV microscope imaging system with wide range zoom capability", issued on Dec. 7, 1999, U.S. Pat. No. 7,515,649, entitled "Surface inspection system using laser line illumination with two dimensional imaging", issued on Apr. 28, 2009. All of these patents are incorporated herein by reference.

Figure 11A:
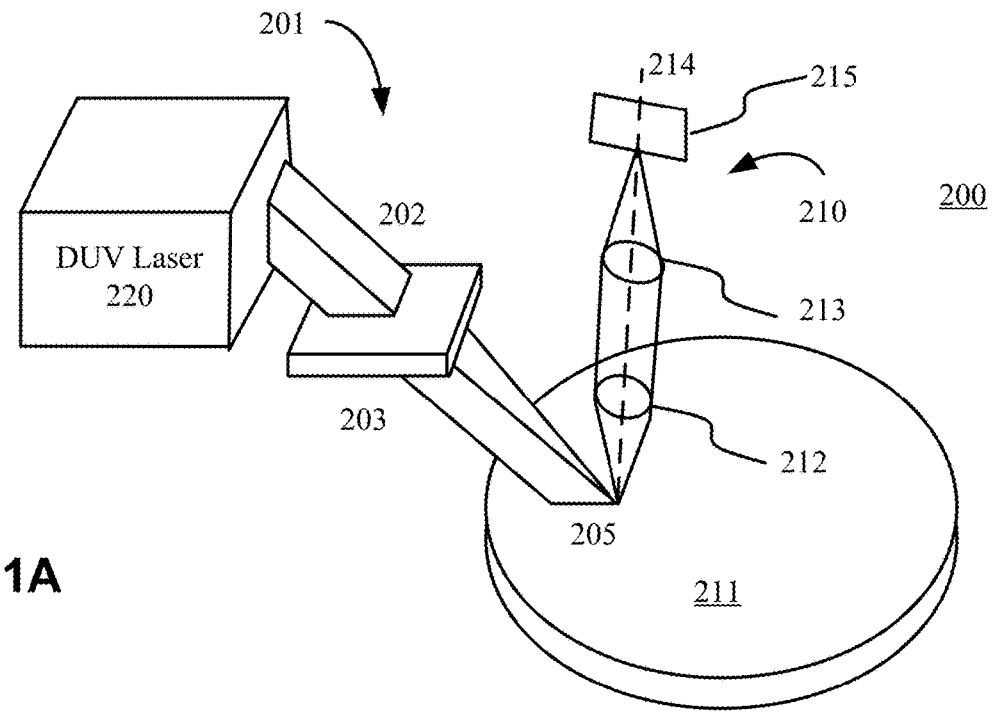
FIGS. 11A and 11B illustrates an exemplary inspection system with line illumination and one or more collection channels.
Figure 11B:
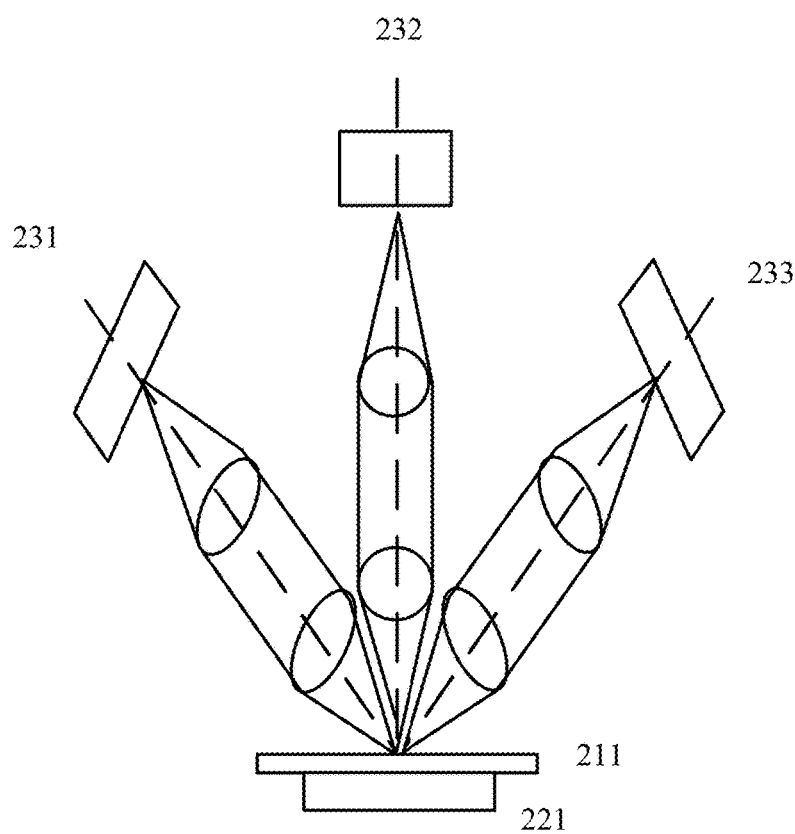

FIGS. 11A and 11B illustrate aspects of dark-field inspection systems that incorporate sensors and/or methods described herein in accordance with other exemplary embodiments of the present invention. In FIG. 11A, illumination optics 201 comprises a laser system 220, which generates light 202 that is focused by a mirror or lens 203 into a line 205 on surface of a wafer or photomask (sample) 211 being inspected. The sample being inspected may be patterned or unpatterned. Collection optics 210 directs light scattered from line 205 to a sensor 215 using lenses and/or mirrors 212 and 213. An optical axis 214 of collection optics 210 is not in the illumination plane of line 205. In some embodiments, optical axis 214 is approximately perpendicular to line 205. Sensor 215 comprises an array sensor, such as a linear array sensor. Sensor 215 may comprise a sensor as described herein, and/or one of the methods described herein may be used to read out the sensor.

FIG. 11B illustrates one embodiment of multiple darkfield collection systems 231, 232 and 233, each collection system substantially similar to collection optics 210 of FIG. 11A. Collection systems 231, 232 and 233 may be used in combination with illumination optics substantially similar to illumination optics 201 of FIG. 11A. Each collection system 231, 232 and 233 incorporates one, or more, of the sensors described herein. Sample 211 is supported on stage 221, which moves the areas to be inspected underneath the optics. Stage 221 may comprise an X-Y stage or an R-θ stage, which preferably moves substantially continuously during the inspection to inspect large areas of the sample with minimal dead time.

More details of inspection systems in accordance with the embodiments illustrated in FIGS. 11A and 11B are described in U.S. patent application Ser. No. 15/153,542 entitled "Sensor With Electrically Controllable Aperture For Inspection And Metrology Systems", filed May 12, 2016, U.S. Pat. No. 7,515,649, entitled "Surface inspection system using laser line illumination with two dimensional imaging", issued on Apr. 28, 2009, and U.S. Pat. No. 6,608,676, entitled "System for detecting anomalies and/or features of a surface", issued on Aug. 19, 2003. All of these patents and patent applications are incorporated herein by reference.

Figure 12:
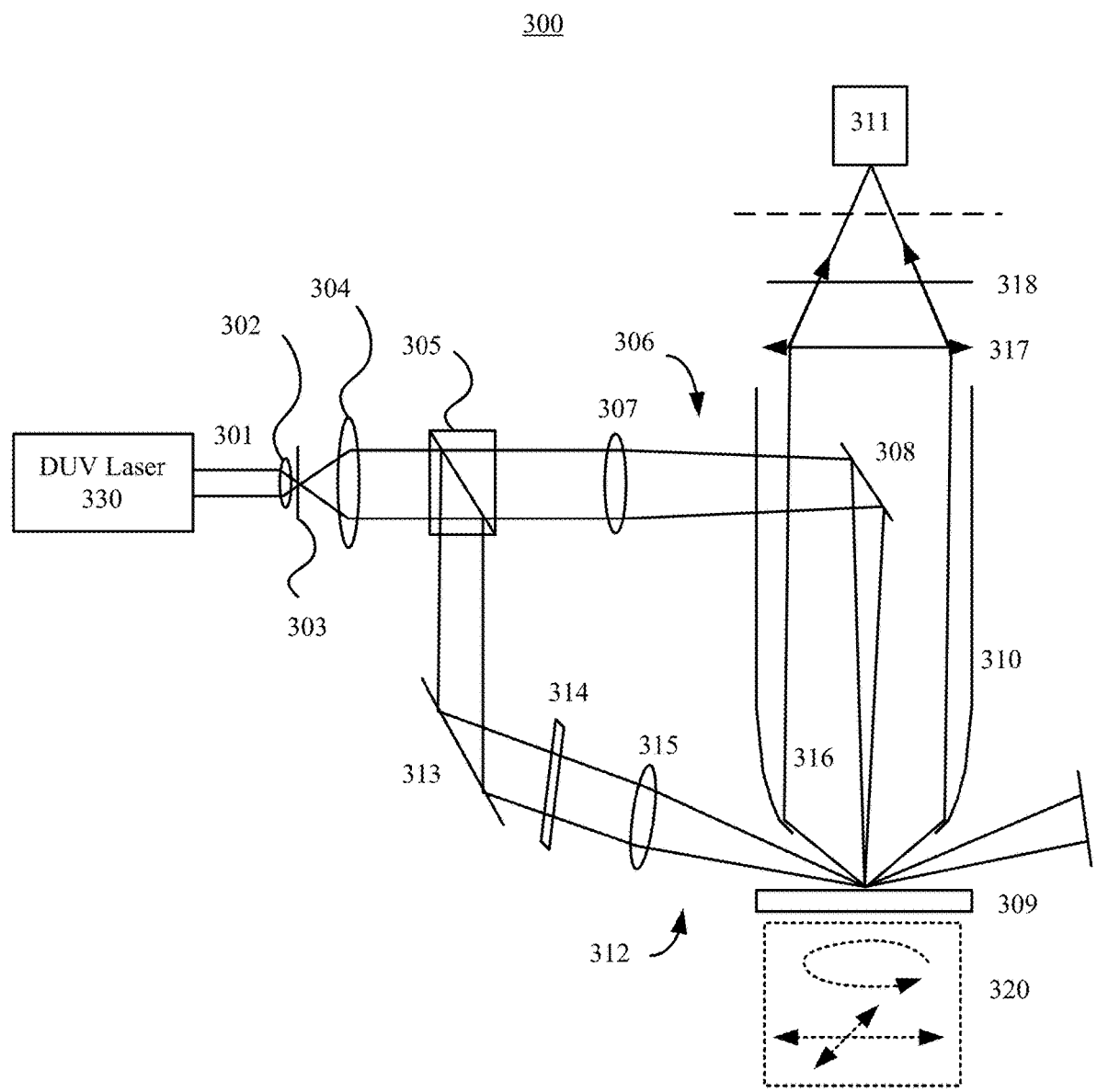
FIG. 12 illustrates an exemplary inspection system with normal and oblique illumination.

FIG. 12 illustrates an inspection system 300 configured to detect particles or defects on a sample, such as an unpatterned wafer, using both normal and oblique illumination beams. In this configuration, a laser system 330 provides a laser beam 301. A lens 302 focuses beam 301 through a spatial filter 303. Lens 304 collimates the beam and conveys it to a polarizing beam splitter 305. Beam splitter 305 passes a first polarized component to the normal illumination channel and a second polarized component to the oblique illumination channel, where the first and second components are orthogonal. In a normal illumination channel 306, the first polarized component is focused by optics 307 and reflected by a mirror 308 towards a surface of a sample 309. The radiation scattered by sample 309 (such as a wafer or photomask) is collected and focused by a paraboloidal mirror 310 to a sensor 311.

In an oblique illumination channel 312, the second polarized component is reflected by a beam splitter 305 to a mirror 313 which reflects such beam through a half-wave plate 314 and focused by optics 315 to sample 309. Radiation originating from the oblique illumination beam in oblique channel 312 and scattered by sample 309 is collected by paraboloidal mirror 310 and focused to sensor 311. Sensor 311 and the illuminated area (from the normal and oblique illumination channels on sample 309) are preferably at the foci of paraboloidal mirror 310.

Paraboloidal mirror 310 collimates the scattered radiation from sample 309 into a collimated beam 316. Collimated beam 316 is then focused by an objective 317 and through an analyzer 318 to sensor 311. Note that curved mirrored surfaces having shapes other than paraboloidal shapes may also be used. An instrument 320 can provide relative motion between the beams and sample 309 so that spots are scanned across the surface of sample 309. Sensor 311 may comprise one or more of the sensors described herein. U.S. Pat. No. 6,201,601, entitled "Sample inspection system", issued to Vaez-Iravani et al. on Mar. 13, 2001, U.S. Pat. No. 9,279,774, entitled "Wafer Inspection", issued to Romanovsky et al. on Mar. 8, 2016, and U.S. Published Application 2016-0097727, entitled "TDI Sensor in a Darkfield System" by Vazhaeparambil et al. and published on Apr. 7, 2016, describe additional aspects and details of inspection system 300. These documents are incorporated herein by reference.

The various embodiments of the structures and methods of this invention that are described above are illustrative only of the principles of this invention and are not intended to limit the scope of the invention to the particular embodiments described. For example, one or more CCD array sensors, including three-phase sensors or other multi-phase sensors, and/or CCD line sensors may be utilized in an inspection system to inspect a sample.

The image sensors described herein may be incorporated into a module or system such as one described in U.S. Pat. No. 8,754,972, entitled "Integrated multi-channel analog front end and digitizer for high speed imaging applications", issued on Jun. 17, 2014 to Brown et al. This patent is incorporated herein by reference.

It is also to be understood that where sensors or methods are described as detecting light that these descriptions may also apply to detecting electromagnetic radiation of different wavelengths including infra-red, visible light, ultra-violet, extreme UV and X-rays, and to detecting charged particles such as electrons.

Thus, the invention is limited only by the following claims and their equivalents.

The invention claimed is:

1. A multiple-column-per-channel charge-coupled-device (CCD) image sensor comprising:
 a pixel array including a plurality of pixels arranged in a plurality of columns and a plurality of pixel rows, the pixel array being configured to generate image charges and to sequentially transfer each said image charge between associated pixels disposed in a corresponding said column in response to a plurality of pixel control signals, whereby a set of image charges disposed in a first said pixel row is simultaneously transferred to an adjacent second said pixel row during each cycle of said plurality of pixel control signals;

a readout circuit comprising:

a plurality of buffer cells disposed to simultaneously receive image charges from an edge pixel row in response to one or more buffer control signals such that each buffer cell receives a corresponding image charge from an associated pixel of said edge pixel row upon assertion of said one or more buffer control signals;

a plurality of transfer gates disposed in said plurality of columns and arranged in a plurality of transfer gate rows including a first transfer gate row disposed to receive a corresponding image charge from an associated said buffer cell, each of said plurality of transfer gates being operably controlled by and associated transfer clock signal;

a summing gate coupled to a last transfer gate row; and an output circuit coupled to the summing gate, wherein said plurality of transfer gates are configured and coupled such that asserting a first transfer clock signal during a first time periodcauses a first image charge to be transferred from a first said buffer cell to a first transfer gate, and causes a second image charge to be transferred from a second said transfer gate to a third said transfer gate, wherein said first buffer cell and said first transfer gate are disposed in a first said column, and said second transfer gate and said third transfer gate are disposed in a second said column, and wherein the summing gate is configured to receive the second image charge from the second column during a second time period subsequent to the first time period in accordance with a summing gate control signal, and the summing gate is further configured to receive the first image charge from the first column during a third time period subsequent to the second time period in accordance with the summing gate control signal and wherein a clock rate of the summing gate control signal is at least two times faster than a line clock rate of the plurality of pixel control signals.

2. The sensor of claim 1, wherein said plurality of transfer gates are further configured such that asserting said first transfer clock signal during said first time periodfurther causes a third image charge to be transferred from a fourth said transfer gate to a fifth said transfer gate, wherein said fourth transfer gate and said fifth transfer gate are disposed in a third said column, and wherein said first transfer gate and said fourth transfer gate are disposed in said first transfer gate row, said second transfer gate and said fifth transfer gate are disposed in a second transfer gate row disposed below the first transfer gate row, and said third transfer gate is disposed in a third transfer gate row disposed below the second transfer gate row.

3. The sensor of claim 1, wherein the output circuit comprises a floating diffusion configured to receive and store said image charges, and an amplifier coupled to the floating diffusion and configured to generate a corresponding output voltage signal in accordance with each said image charge stored on the floating diffusion.

4. The sensor of claim 1, wherein the readout circuit includes a plurality of readout structures, each said readout structure connected to an associated group of said columns and includes a corresponding plurality of said transfer gates, a corresponding said summing gate, and a corresponding said output circuit.

5. The sensor of claim 4, wherein said amplifier of each said readout structure comprises a metal interconnect, wherein capacitances of the metal interconnects of different amplifiers are substantially similar.

6. The sensor of claim 4, wherein each said amplifier comprises a metal interconnect, wherein areas of the metal interconnects of different amplifiers are substantially similar.

7. The sensor of claim 4, wherein the array of pixels consists of one or more rows of pixels.

8. The sensor of claim 2, wherein the sensor further comprises an output control circuit configured to operably control the summing gate such that a fourth image charge is transferred from a sixth said transfer gate to said summing gate during the first time period, wherein said sixth transfer gate is disposed in said first column and disposed in said third transfer gate row.

9. The sensor of claim 8, wherein said plurality of transfer gates are further configured such that asserting a second transfer clock signal during a second time periodcauses a fourth image charge to be transferred from a second said buffer cell to a seventh said transfer gate, causes said first image charge to be transferred from said first transfer gate to an eighth said transfer gate, and causes said third image charge to be transferred from said fifth said transfer gate to a ninth said transfer gate, wherein the said second buffer cell is disposed in said third column, wherein said seventh transfer gate is disposed in said second column and said first transfer gate row, wherein said eighth transfer gate is disposed in said first column and said second transfer gate row, and wherein said ninth transfer gate is disposed in said third column and said third transfer gate row.

10. The sensor of claim 9, wherein the output control circuit is further configured to operably control the output circuit and the summing gate such that said fourth image charge is transferred from said summing gate to a floating diffusion and said second image charge is transferred from said third transfer gate to said summing gate during the second time period.

11. The sensor of claim 10, wherein said plurality of transfer gates are further configured such that asserting a third transfer clock signal during a third time periodcauses a sixth image charge to be transferred from a third said buffer cell to said fourth transfer gate, causes said first image charge to be transferred from said eighth transfer gate to said sixth transfer gate, and causes said fourth image charge to be transferred from said seventh transfer gate to said second transfer gate.

12. The sensor of claim 11, wherein the output control circuit is further configured to operably control the output circuit and the summing gate such that said second image charge is transferred from said summing gate to said floating diffusion and said third image charge is transferred from said ninth transfer gate to said summing gate during the third time period.

13. The sensor of claim 12, further comprising a buffer control circuit configured to control the first, second and third buffer cells to simultaneously respectively receive seventh, eighth and ninth image charges from said edge pixel row during the third time period and after the sixth image charge is transferred from said third said buffer cell to said fourth transfer gate.

14. A method of inspecting a sample, the method comprising:
- directing and focusing radiation onto the sample while moving the sample relative to a source of said radiation;
- directing received radiation from the sample to an image sensor, the image sensor comprising a multiple-column-per-channel charge-coupled-device (CCD) including an array of pixels arranged in a plurality of rows and a plurality of associated groups of adjacent columns, each said associated group including at least a first column a second column and a third column;
- driving the image sensor with line clock signals that are synchronized to said moving of the sample relative to the radiation source, the line clock signals causing first and second charges to be respectively transferred along the first, second and third columns from one said row of pixels to an adjacent said row of pixels;
- driving a row of buffer cells of the image sensor with a buffer clock signal, the buffer clock signal causing said first and second charges to be respectively transferred from an edge pixel row of pixels in the first, second and third columns of each associated group of columns to first, second and third buffer cells of the row of buffer cells;
- simultaneously driving with a first transfer clock signal during a first time period a first transfer gate, a third transfer gate and a fifth transfer gate, said first transfer gate being disposed in a first row of said transfer gates and disposed in the first column, the third transfer gate being disposed in a third row of said transfer gates and disposed in the second column, and the fifth transfer gate being disposed in a second row of said transfer gates and disposed in the third column,
- simultaneously driving with a second transfer clock signal during a second time period a seventh transfer gate, an eighth transfer gate and a ninth transfer gate, said seventh transfer gate being disposed in the first row of said transfer gates and disposed in the second column, the eighth transfer gate being disposed in said second row of said transfer gates and disposed in the first column, and the ninth transfer gate being disposed in the third row of said transfer gates and disposed in the third column,
- simultaneously driving with a third transfer clock signal during a third time period a fourth transfer gate, a second transfer gate and a sixth transfer gate, said fourth transfer gate being disposed in the first row of said transfer gates and disposed in the third column, the second transfer gate being disposed in said second row of said transfer gates and disposed in the second column, and the sixth transfer gate being disposed in the third row of said transfer gates and disposed in the first column,
- utilizing an output circuit and an analog-to-digital converter (ADC) circuit to sequentially convert image charges transferred along the first, second and third columns to digital numbers,
- wherein utilizing the ADC circuit includes driving the ADC circuit with a clock frequency greater than at least three times a frequency of the line clock signals.

15. The method of claim 14, wherein simultaneously driving with said first transfer clock signal comprises asserting the first transfer clock signal such that a first image charge is transferred from said first buffer cell to said first transfer gate, causes a second image charge to be transferred from said second transfer gate to said third transfer gate, and causes a third image charge to be transferred from said fourth transfer gate to said fifth transfer gate during the first time period.

16. The method of claim 15, wherein utilizing said output circuit comprises controlling a summing gate such that a fourth image charge is transferred from said sixth transfer gate to said summing gate during the first time period.

17. The method of claim 16, wherein simultaneously driving with said second transfer clock signal comprises asserting the second transfer clock signal such that a fourth image charge is transferred from said second buffer cell to said seventh transfer gate, said first image charge is transferred from said first transfer gate to said eighth transfer gate, and said third image charge is transferred from said fifth transfer gate to said transfer gate during said second time period.

18. The method of claim 17, wherein utilizing said output circuit further comprises controlling said summing gate and a sense node such that said fourth image charge is transferred from said summing gate to a floating diffusion and said second image charge is transferred from said third transfer gate to said summing gate during the second time period.

19. The method of claim 18, wherein simultaneously driving with said third transfer clock signal comprises asserting the third transfer clock signal such that during said third time period a sixth image charge is transferred from said third buffer cell to said fourth transfer gate, said first image charge is transferred from said eighth transfer gate to said sixth transfer gate, and said fourth image charge is transferred from said seventh transfer gate to said second transfer gate.

20. The method of claim 19, wherein utilizing said output circuit further comprises controlling said summing gate and said sense node such that said second image charge is transferred from said summing gate to said floating diffusion and said third image charge is transferred from said ninth transfer gate to said summing gate during the third time period.

21. The method of claim 20, further comprises driving said row of buffer cells such that the first, second and third buffer cells simultaneously respectively receive seventh, eighth and ninth image charges from said edge pixel row during the third time period and after the sixth image charge is transferred from said third said buffer cell to said fourth transfer gate.

* * * * *